(12) United States Patent
Mak et al.

(10) Patent No.: US 6,849,545 B2
(45) Date of Patent: Feb. 1, 2005

(54) SYSTEM AND METHOD TO FORM A COMPOSITE FILM STACK UTILIZING SEQUENTIAL DEPOSITION TECHNIQUES

(75) Inventors: Alfred W. Mak, Union City, CA (US); Mei Chang, Saratoga, CA (US); Jeong Soo Byun, Cupertino, CA (US); Hua Chung, San Jose, CA (US); Ashok Sinha, Palo Alto, CA (US); Moris Kori, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/885,609

(22) Filed: Jun. 20, 2001

(65) Prior Publication Data

US 2002/0197863 A1 Dec. 26, 2002

(51) Int. Cl.[7] ............................................. H01L 21/44
(52) U.S. Cl. ..................... 438/679; 438/769; 438/775; 438/770; 438/685; 438/683; 438/682; 257/751; 427/255.2
(58) Field of Search .................. 438/679, 627, 438/644, 654, 682, 683, 685, 769, 770, 775

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,767,494 A | 8/1988 | Kobayashi et al. |
| 4,806,321 A | 2/1989 | Nishizawa et al. |
| 4,840,921 A | 6/1989 | Matsumoto |
| 4,845,049 A | 7/1989 | Sunakawa |
| 4,859,627 A | 8/1989 | Sunakawa |
| 4,861,417 A | 8/1989 | Mochizuki et al. |
| 4,876,218 A | 10/1989 | Pessa et al. |
| 4,993,357 A | 2/1991 | Scholz |
| 5,082,798 A | 1/1992 | Arimoto |
| 5,130,269 A | 7/1992 | Kitahara et al. |
| 5,166,092 A | 11/1992 | Mochizuki et al. |
| 5,225,366 A | 7/1993 | Yoder |
| 5,250,148 A | 10/1993 | Nishizawa et al. |
| 5,256,244 A | 10/1993 | Ackerman |
| 5,270,247 A | 12/1993 | Sakuma et al. |
| 5,278,435 A | 1/1994 | Van Hove et al. |
| 5,281,274 A | 1/1994 | Yoder |
| 5,290,748 A | 3/1994 | Knuuttila et al. |
| 5,294,286 A | 3/1994 | Nishizawa et al. |
| 5,300,186 A | 4/1994 | Kitahara et al. |

(List continued on next page.)

FOREIGN PATENT DOCUMENTS

| | | | |
|---|---|---|---|
| EP | 0799641 | 10/1997 | |
| EP | 1 167 569 | 1/2002 | ......... C23C/16/455 |
| GB | 2355747 | 5/2001 | ........... C23C/16/44 |

(List continued on next page.)

OTHER PUBLICATIONS

Rossnagel, et al. "Plasma–enhanced Atomic Layer Deposition of Ta and Ti for Interconnect Diffusion Barriers," J. Vacuum Sci. & Tech. B., vol. 18, No. 4 (Jul. 2000), pp. 2016–2020.

(List continued on next page.)

*Primary Examiner*—David Nelms
*Assistant Examiner*—Renee R. Berry
(74) *Attorney, Agent, or Firm*—Moser, Patterson & Sheridan

(57) ABSTRACT

A system and method to form a stacked barrier layer for copper contacts formed on a substrate. The substrate is serially exposed to first and second reactive gases to form an adhesion layer. Then, the adhesion layer is serially exposed to third and fourth reactive gases to form a barrier layer adjacent to the adhesion layer. This is followed by deposition of a copper layer adjacent to the barrier layer.

49 Claims, 6 Drawing Sheets

U.S. PATENT DOCUMENTS

| | | | |
|---|---|---|---|
| 5,306,666 A | 4/1994 | Izumi .................... 437/192 |
| 5,316,793 A | 5/1994 | Wallace et al. |
| 5,330,610 A | 7/1994 | Eres et al. |
| 5,336,324 A | 8/1994 | Stall et al. |
| 5,338,389 A | 8/1994 | Nishizawa et al. |
| 5,374,570 A | 12/1994 | Nasu et al. |
| 5,395,791 A | 3/1995 | Cheng et al. |
| 5,443,033 A | 8/1995 | Nishizawa et al. |
| 5,443,647 A | 8/1995 | Aucoin et al. |
| 5,458,084 A | 10/1995 | Thorne et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,526,244 A | 6/1996 | Bishop .................... 362/147 |
| 5,532,511 A | 7/1996 | Nishizawa et al. |
| 5,580,380 A | 12/1996 | Liu et al. |
| 5,637,530 A | 6/1997 | Gaines et al. |
| 5,693,139 A | 12/1997 | Nishizawa et al. |
| 5,705,224 A | 1/1998 | Murota et al. |
| 5,711,811 A | 1/1998 | Suntola et al. |
| 5,730,802 A | 3/1998 | Ishizumi et al. |
| 5,804,488 A | 9/1998 | Shih et al. |
| 5,851,849 A | 12/1998 | Comizzoli et al. |
| 5,855,680 A | 1/1999 | Soininen et al. |
| 5,866,795 A | 2/1999 | Wang et al. |
| 5,879,459 A | 3/1999 | Gadgil et al. |
| 5,916,365 A | 6/1999 | Sherman |
| 5,972,179 A | 10/1999 | Chittipeddi et al. ... 204/192.17 |
| 5,989,623 A | 11/1999 | Chen et al. .................... 427/97 |
| 6,015,590 A | 1/2000 | Suntola et al. |
| 6,025,627 A | 2/2000 | Forbes et al. |
| 6,036,773 A | 3/2000 | Wang et al. |
| 6,042,652 A | 3/2000 | Hyun et al. .................... 117/719 |
| 6,043,177 A | 3/2000 | Falconer et al. |
| 6,071,808 A | 6/2000 | Merchant et al. |
| 6,084,302 A | 7/2000 | Sandhu |
| 6,113,977 A | 9/2000 | Soininen et al. |
| 6,124,158 A | 9/2000 | Dautartas et al. |
| 6,130,147 A | 10/2000 | Major et al. |
| 6,139,700 A | 10/2000 | Kang et al. ............ 204/192.17 |
| 6,140,237 A | 10/2000 | Chan et al. |
| 6,140,238 A | 10/2000 | Kitch |
| 6,144,060 A | 11/2000 | Park |
| 6,183,563 B1 | 2/2001 | Choi et al. .................... 118/715 |
| 6,197,683 B1 | 3/2001 | Kang et al. .................... 438/643 |
| 6,200,893 B1 | 3/2001 | Sneh |
| 6,207,487 B1 | 3/2001 | Kim et al. .................... 438/238 |
| 6,218,298 B1 | 4/2001 | Hoinkis |
| 6,231,672 B1 | 5/2001 | Choi et al. .................... 118/715 |
| 6,284,646 B1 | 9/2001 | Leem .................... 438/629 |
| 6,287,965 B1 | 9/2001 | Kang et al. .................... 438/648 |
| 6,333,260 B1 | 12/2001 | Kwon et al. .................... 438/643 |
| 6,335,280 B1 | 1/2002 | van der Jeugd |
| 6,342,277 B1 | 1/2002 | Sherman .................... 427/562 |
| 6,348,376 B2 | 2/2002 | Lim et al. .................... 438/253 |
| 6,355,561 B1 | 3/2002 | Sandhu et al. .................... 438/676 |
| 6,358,829 B2 | 3/2002 | Yoon et al. .................... 438/597 |
| 6,368,954 B1 | 4/2002 | Lopatin et al. .................... 438/627 |
| 6,369,430 B1 | 4/2002 | Adetutu et al. .................... 257/382 |
| 6,372,598 B2 | 4/2002 | Kang et al. .................... 438/399 |
| 6,391,785 B1 | 5/2002 | Satta et al. .................... 438/704 |
| 6,399,491 B2 | 6/2002 | Jeon et al. .................... 438/680 |
| 6,416,577 B1 | 7/2002 | Suntoloa et al. .................... 117/88 |
| 6,420,189 B1 | 7/2002 | Lopatin .................... 438/2 |
| 6,423,619 B1 | 7/2002 | Grant et al. .................... 438/589 |
| 6,432,821 B1 | 8/2002 | Dubin et al. .................... 438/678 |
| 6,447,607 B2 | 9/2002 | Soininen et al. .................... 117/200 |
| 6,447,933 B1 | 9/2002 | Wang et al. .................... 428/635 |
| 6,451,119 B2 | 9/2002 | Sneh et al. .................... 118/715 |
| 6,451,695 B2 | 9/2002 | Sneh .................... 438/685 |
| 6,455,421 B1 | 9/2002 | Itoh et al. .................... 438/656 |
| 6,458,701 B1 | 10/2002 | Chae et al. .................... 438/680 |
| 6,468,924 B2 | 10/2002 | Lee et al. .................... 438/763 |
| 6,475,276 B1 | 11/2002 | Elers et al. .................... 117/84 |
| 6,475,910 B1 | 11/2002 | Sneh .................... 438/685 |
| 6,478,872 B1 | 11/2002 | Chae et al. .................... 117/88 |
| 6,481,945 B1 | 11/2002 | Hasper et al. .................... 414/217 |
| 6,482,262 B1 | 11/2002 | Elers et al. .................... 117/84 |
| 6,482,733 B2 | 11/2002 | Raaijmakers et al. ....... 438/633 |
| 6,482,740 B2 | 11/2002 | Soininen et al. .................... 438/686 |
| 6,511,539 B1 | 1/2003 | Raaijmakers et al. ....... 117/102 |
| 6,534,395 B2 | 3/2003 | Werkhoven et al. ........ 438/627 |
| 6,548,424 B2 | 4/2003 | Putkonen .................... 438/785 |
| 6,551,929 B1 | 4/2003 | Kori et al. |
| 6,599,572 B2 | 7/2003 | Saanila et al. |
| 6,607,976 B2 | 8/2003 | Chen et al. |
| 6,632,279 B1 | 10/2003 | Ritala et al. |
| 6,686,271 B2 | 2/2004 | Raaijmakers et al. |
| 2001/0002280 A1 | 5/2001 | Sneh .................... 427/255.28 |
| 2001/0009140 A1 | 7/2001 | Bondestam et al. ........ 118/725 |
| 2001/0009695 A1 | 7/2001 | Saanila et al. .................... 427/255.39 |
| 2001/0013312 A1 | 8/2001 | Soininen et al. .................... 117/86 |
| 2001/0014371 A1 | 8/2001 | Kilpi .................... 427/255.28 |
| 2001/0024387 A1 | 9/2001 | Raaijmakers et al. ....... 365/200 |
| 2001/0028924 A1 | 10/2001 | Raaijmakers et al. ....... 365/200 |
| 2001/0029094 A1 | 10/2001 | Mee-Young et al. ........ 438/597 |
| 2001/0042523 A1 | 11/2001 | Kesala .................... 122/6.6 |
| 2001/0050039 A1 | 12/2001 | Park .................... 117/102 |
| 2001/0054377 A1 | 12/2001 | Lindfors et al. ............ 117/104 |
| 2001/0054730 A1 | 12/2001 | Kim et al. .................... 257/301 |
| 2001/0054769 A1 | 12/2001 | Raaijmakers et al. ....... 257/758 |
| 2002/0000196 A1 | 1/2002 | Park .................... 118/715 |
| 2002/0000598 A1 | 1/2002 | Kim et al. .................... 257/301 |
| 2002/0004293 A1 | 1/2002 | Soinnen et al. ............. 438/584 |
| 2002/0007790 A1 | 1/2002 | Park .................... 118/715 |
| 2002/0019121 A1 | 2/2002 | Pyo .................... 438/618 |
| 2002/0021544 A1 | 2/2002 | Cho et al. .................... 361/200 |
| 2002/0031618 A1 | 3/2002 | Sherman .................... 427/569 |
| 2002/0037630 A1 | 3/2002 | Agarwal et al. ............ 438/430 |
| 2002/0041931 A1 | 4/2002 | Suntola et al. ......... 427/255.28 |
| 2002/0048635 A1 | 4/2002 | Kim et al. .................... 427/331 |
| 2002/0048880 A1 | 4/2002 | Lee .................... 438/253 |
| 2002/0052097 A1 | 5/2002 | Park .................... 438/507 |
| 2002/0055235 A1 | 5/2002 | Agarwal et al. ............ 438/430 |
| 2002/0061612 A1 | 5/2002 | Sandhu et al. .................... 438/151 |
| 2002/0074588 A1 | 6/2002 | Lee .................... 257/306 |
| 2002/0076507 A1 | 6/2002 | Chiang et al. ............. 427/569 |
| 2002/0076837 A1 | 6/2002 | Hujanen et al. ............... 438/3 |
| 2002/0081844 A1 | 6/2002 | Jeon et al. .................... 438/680 |
| 2002/0086106 A1 | 7/2002 | Park et al. ............. 427/248.1 |
| 2002/0086111 A1 | 7/2002 | Byun et al. |
| 2002/0086507 A1 | 7/2002 | Park et al. .................... 438/585 |
| 2002/0090829 A1 | 7/2002 | Sandhu .................... 438/761 |
| 2002/0092471 A1 | 7/2002 | Kang et al. .................... 118/715 |
| 2002/0094689 A1 | 7/2002 | Park .................... 438/694 |
| 2002/0105088 A1 | 8/2002 | Yang et al. .................... 257/774 |
| 2002/0106536 A1 | 8/2002 | Lee et al. .................... 428/702 |
| 2002/0106846 A1 | 8/2002 | Seutter et al. ............. 438/200 |
| 2002/0108570 A1 | 8/2002 | Lindfors .................... 118/715 |
| 2002/0109168 A1 | 8/2002 | Kim et al. .................... 257/295 |
| 2002/0117399 A1 | 8/2002 | Chen et al. .................... 205/125 |
| 2002/0121241 A1 | 9/2002 | Nguyen et al. |
| 2002/0121342 A1 | 9/2002 | Nguyen et al. |
| 2002/0121697 A1 | 9/2002 | Marsh .................... 257/751 |
| 2002/0134307 A1 | 9/2002 | Choi .................... 118/715 |
| 2002/0135071 A1 | 9/2002 | Kang et al. .................... 257/767 |
| 2002/0155722 A1 | 10/2002 | Satta et al. .................... 438/704 |
| 2002/0162506 A1 | 11/2002 | Sneh et al. .................... 118/715 |
| 2002/0177282 A1 | 11/2002 | Song .................... 438/300 |
| 2002/0182320 A1 | 12/2002 | Leskala et al. ............. 427/250 |
| 2002/0187256 A1 | 12/2002 | Elers et al. .................... 427/99 |

| | | |
|---|---|---|
| 2002/0187631 A1 | 12/2002 | Kim et al. .................. 438/637 |
| 2002/0190168 A1 | 12/2002 | Hall et al. ............... 248/188.7 |
| 2003/0013300 A1 | 1/2003 | Byun |
| 2003/0013320 A1 | 1/2003 | Kim et al. .................. 438/778 |
| 2003/0031807 A1 | 2/2003 | Elers et al. ................. 427/569 |
| 2003/0032281 A1 | 2/2003 | Werkhoven et al. ........ 438/640 |
| 2003/0049942 A1 | 3/2003 | Haukka et al. ............. 438/778 |
| 2003/0054631 A1 | 3/2003 | Raajimakers et al. |
| 2003/0072975 A1 | 4/2003 | Shero et al. ................ 428/704 |
| 2003/0082300 A1 | 5/2003 | Todd et al. ............ 427/255.27 |
| 2003/0101927 A1 | 6/2003 | Raajimakers |
| 2003/0104126 A1 | 6/2003 | Fang et al. |
| 2003/0129826 A1 | 7/2003 | Werkhoven et al. |
| 2003/0134508 A1 | 7/2003 | Raajimakers et al. |
| 2003/0143839 A1 | 7/2003 | Raajimakers et al. |
| 2003/0143841 A1 | 7/2003 | Yang et al. |
| 2003/0165615 A1 | 9/2003 | Asitonen et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0205729 A1 | 11/2003 | Basceri et al. |

FOREIGN PATENT DOCUMENTS

| | | | |
|---|---|---|---|
| JP | 2001-111000 | 12/2000 | .......... H01L/29/00 |
| WO | WO/91/00510 | 1/1991 | |
| WO | WO 98/51838 | 11/1998 | |
| WO | 98/51838 | 11/1998 | .......... C23C/16/06 |
| WO | WO/99/01595 | 1/1999 | |
| WO | 99/01595 | 1/1999 | .......... C30B/25/14 |
| WO | WO/99/29924 | 6/1999 | |
| WO | 99/29924 | 6/1999 | .......... C23C/16/04 |
| WO | WO 99/65064 | 12/1999 | .......... H01L/21/00 |
| WO | 00/15865 | 3/2000 | .......... C23C/16/00 |
| WO | WO/00/15865 | 3/2000 | |
| WO | WO 00/54320 | 9/2000 | .......... H01L/21/44 |
| WO | 00/79576 | 12/2000 | ......... H01L/21/205 |
| WO | WO 01/17692 | 3/2001 | .......... B05C/11/00 |
| WO | WO 02/01628 A2 | 1/2002 | |
| WO | WO 02/08488 | 1/2002 | .......... C23C/16/44 |
| WO | 02/45167 | 6/2002 | .......... H01L/27/00 |
| WO | WO 02/45871 A1 | 6/2002 | |
| WO | 02/067319 | 8/2002 | ......... H01L/21/768 |

OTHER PUBLICATIONS

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35.

Ritala, et al. "Growth of Titanium Dioxide Thin Films by Atomic Layer Epitaxy," Thin Solid Films, vol. 225, No. 1–2 (Mar. 25, 1993) pp. 288–295.

Min, et al. "Chemical Vapor Deposition of Ti–Si–N Films With Alternating Source Supply," Mat. Rec. Soc. Symp. Proc. vol. (1999).

Klaus, et al. "Atomically Controlled Growth of Tungsten and Tungsten Nitride Using Sequential Surface Reactions," Applied Surface Science, 162–163 (2000) 479–491.

PCT International Search Report from International Application No. PCT/US02/19481, Dated Jan. 8, 2003.

Kitagawa et al. *Hydrogen–mediated low–temperature epitaxy of Si in plasma–enhanced chemical vapor* deposition. Applied Surface Science. pp. 30–34 (2000).

Klaus et al. *Atomically controlled growth of tungsten and tungsten nitride using sequential surface reacions.* Applied Surface Science, pp. 479–491(2000).

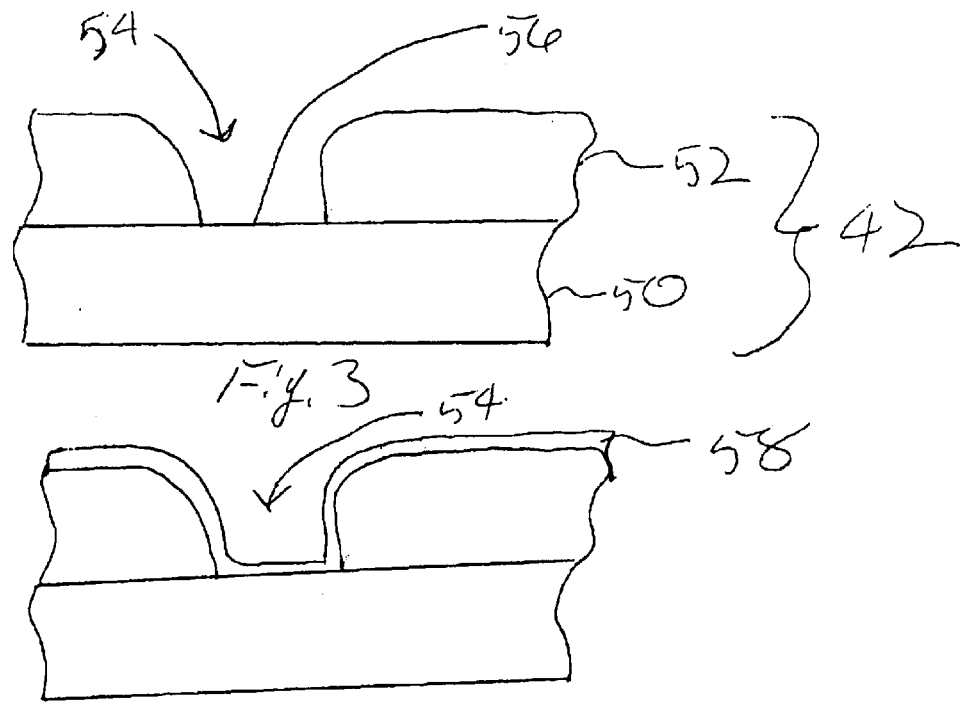
Fig. 3
Fig. 4
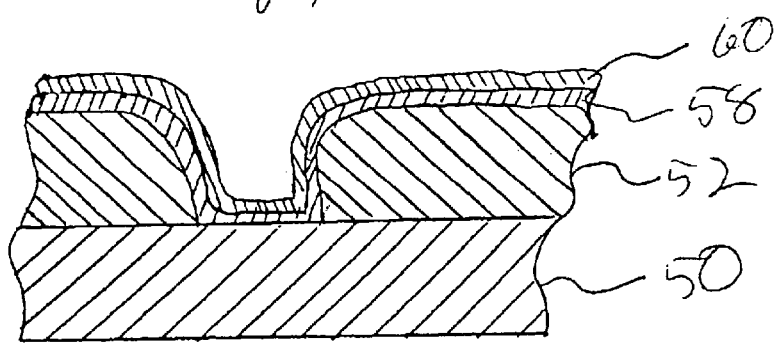
Fig. 5
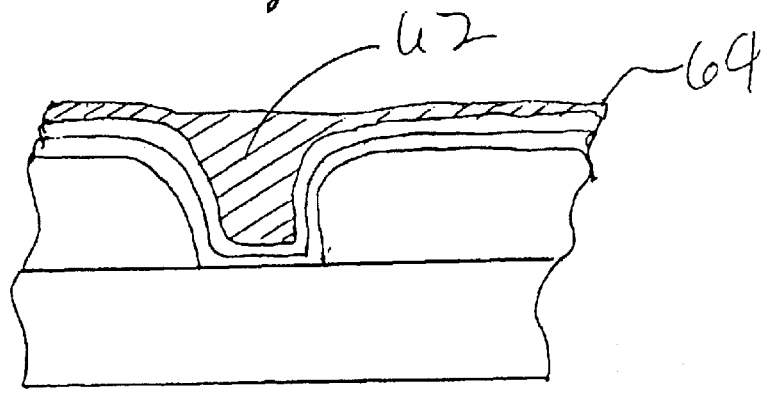
Fig. 6

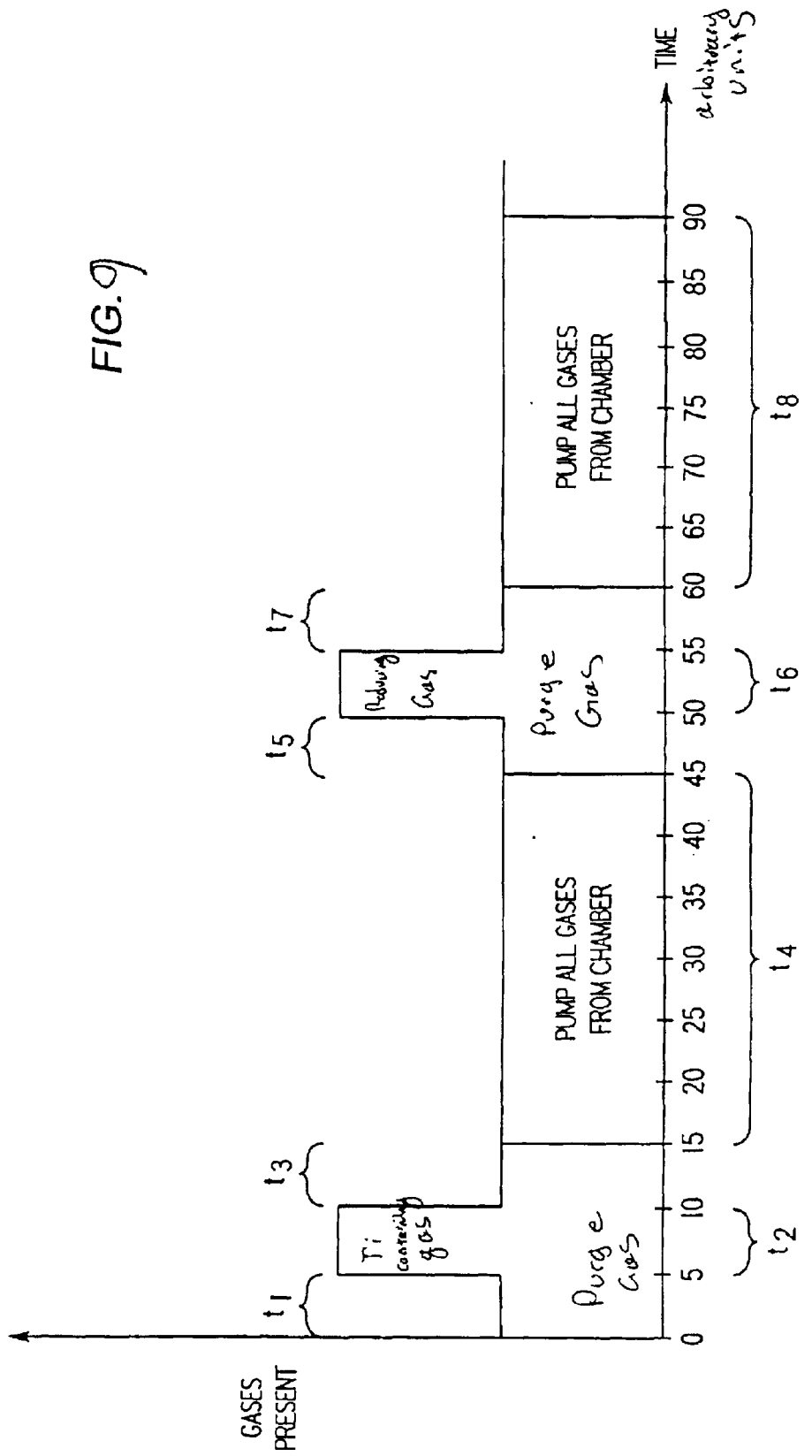

SYSTEM AND METHOD TO FORM A COMPOSITE FILM STACK UTILIZING SEQUENTIAL DEPOSITION TECHNIQUES

BACKGROUND OF THE INVENTION

This invention relates to the processing of semiconductor substrates. More particularly, this invention relates to improvements in the process of forming contacts.

Formation of contacts in multi-level integrated circuits poses many challenges to the semiconductor industry as the drive to increase circuit density continues, due to the reduction in size of the circuit features. Contacts are formed by depositing conductive interconnect material in an opening on the surface of insulating material disposed between two spaced-apart conductive layers. The aspect ratio of such an opening inhibits deposition of conductive interconnect material that demonstrates satisfactory step coverage and gap-fill, employing traditional interconnect material such as aluminum. In addition, diffusion between the aluminum and the surrounding insulating material often occurs, which adversely effects operation of the resulting electrical circuits.

Barrier materials have been introduced to improve both the step coverage and gap-fill of aluminum, while limiting diffusion of the same. Barrier materials must also provide good adhesion properties for aluminum. Otherwise, the thermal and electrical conductance of the resulting contact may be compromised. Examples of barrier materials providing the aforementioned characteristics include TiN, TiW, $TiB_2$, TiC and $Ti_2N$.

However, attempts have been made to provide interconnect material with lower electrical resistivity than aluminum. This has led to the substitution of copper aluminum. Copper, like aluminum, also suffers from diffusion characteristics and may form undesirable intermetallic alloys that reduce the availability of suitable barrier materials.

Tungsten has proved to be a suitable barrier material that effectively prevents diffusion of copper. Typically deposited employing chemical vapor deposition (CVD) techniques, tungsten deposition is attendant with several disadvantages. Tungsten diffuses easily into surrounding dielectric material. In addition, tungsten has proven difficult to deposit uniformly. This has been shown by variance in tungsten layers' thickness of greater than 1%. As result, it is difficult to control the resistivity of a tungsten layer.

What is needed, therefore, are improved techniques to form barrier layers for copper interconnects that include tungsten.

SUMMARY OF THE INVENTION

One embodiment of the present invention is directed to a method to form a stacked barrier layer on a substrate disposed in a processing chamber by serially exposing the substrate to first and second reactive gases to form an adhesion layer. The adhesion layer is then serially exposed to third and fourth reactive gases to form a barrier layer adjacent to the adhesion layer. A copper layer is disposed adjacent to the barrier layer. To that end, another embodiment of the invention is directed to a system to carry out the method.

DETAILED DESCRIPTION OF THE INVENTION

Figure 1:
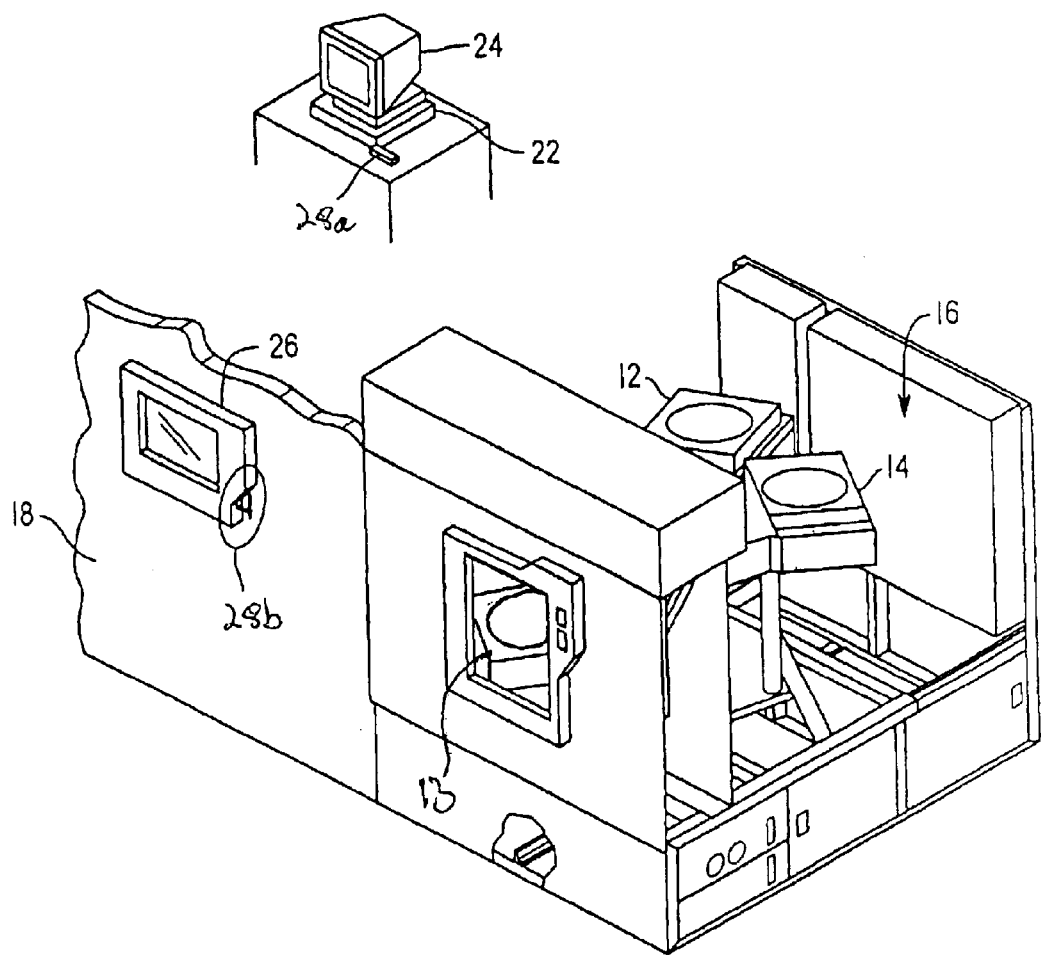
FIG. 1 is a perspective view of a semiconductor processing system in accordance with the present invention.

Referring to FIG. 1, an exemplary wafer processing system includes one or more processing chambers 12, 13 and 14 disposed in a common work area 16 surrounded by a wall 18. Processing chambers 12 and 14 are in data communication with a controller 22 that is connected to one or more monitors, shown as 24 and 26. Monitors 24 and 26 typically display common information concerning the process associated with the processing chambers 12 and 14. Monitor 26 is mounted to the wall 18, with monitor 24 being disposed in the work area 16. Operational control of processing chambers 12 and 14 may be achieved with use of a light pen, associated with one of monitors 24 and 26, to communicate with controller 22. For example, a light pen 28a is associated with monitor 24 and facilitates communication with the controller 22 through monitor 24. A light pen 28b facilitates communication with controller 22 through monitor 26.

Figure 2:
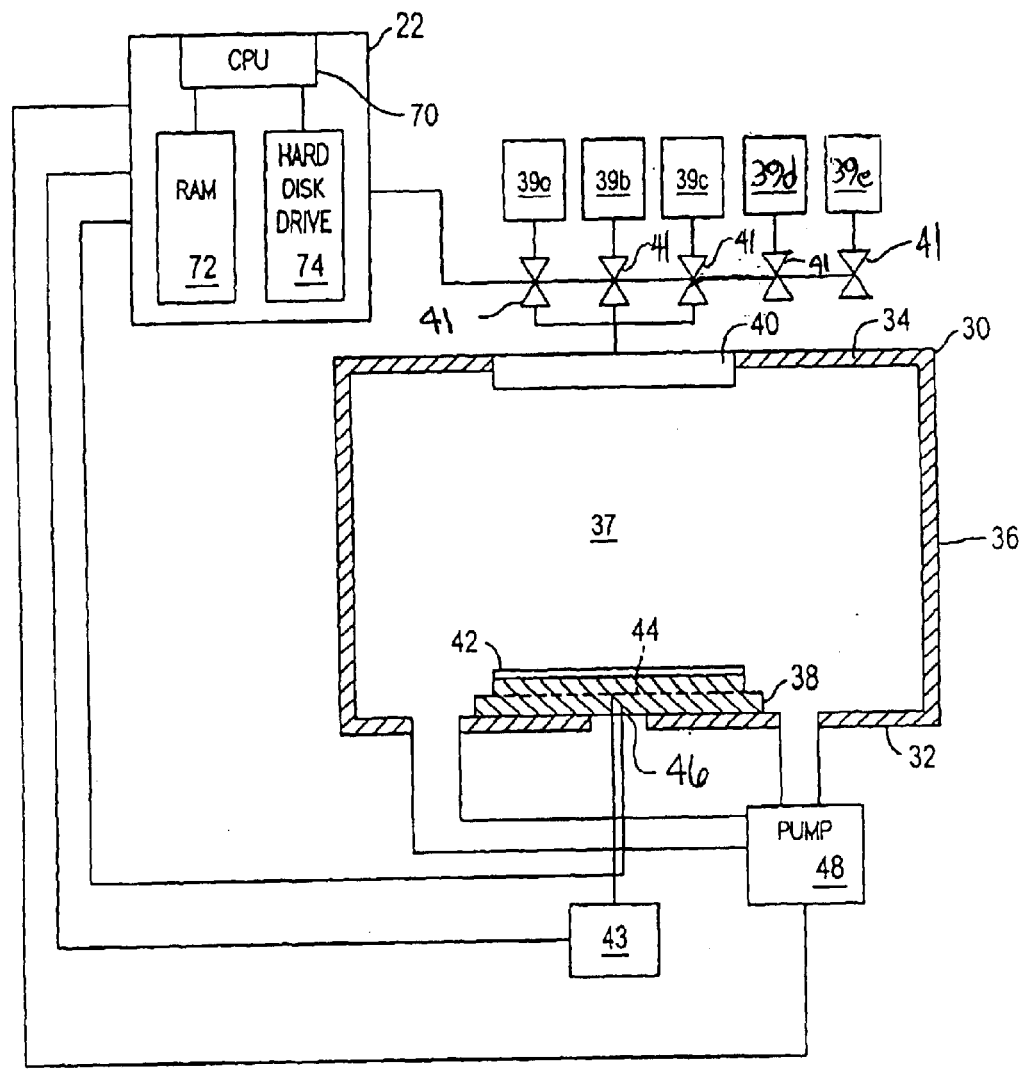
FIG. 2 is a detailed view of the processing chambers shown above in FIG. 1.

Referring both the to FIGS. 1 and 2, each of processing chambers 12 and 14 includes a housing 30 having a base wall 32, a cover 34, disposed opposite to the base wall 32, and a sidewall 36, extending therebetween. Housing 30 defines a chamber 37, and a pedestal 38 is disposed within processing chamber 37 to support a substrate 42, such as a semiconductor wafer. Pedestal 38 may be mounted to move between the cover 34 and base wall 32, using a displacement mechanism (not shown), but is typically fixed proximate to bottom wall 32. Supplies of processing gases 39a, 39b, 39c, 39d and 39e are in fluid communication with the processing chamber 37 via a showerhead 40. Regulation of the flow of gases from supplies 39a, 39b and 39c is effectuated via flow valves 41.

Depending on the specific process, substrate 42 may be heated to a desired temperature prior to layer deposition via a heater embedded within pedestal 38. For example, pedestal 38 may be resistively heated by applying an electric current from an AC power supply 43 to a heater element 44. Substrate 42 is, in turn, heated by pedestal 38, and can be maintained within a desired process temperature range of, for example, about 20° C. to about 750° C., with the actual temperature varying dependent upon the gases employed and the topography of the surface upon which deposition is to occur. A temperature sensor 46, such as a thermocouple, is also embedded in the wafer support pedestal 38 to monitor the temperature of the pedestal 38 in a conventional manner. For example, the measured temperature may be used in a feedback loop to control the electrical current applied to heater element 44 by the power supply 43, such that the wafer temperature can be maintained or controlled at a desired temperature the is suitable for the particular process application. Pedestal 38 is optionally heated using radiant heat (not shown). A vacuum pump 48 is used to evacuate processing chamber 37 and to help maintain the proper gas flows and pressure inside processing chamber 37.

Figure 3:
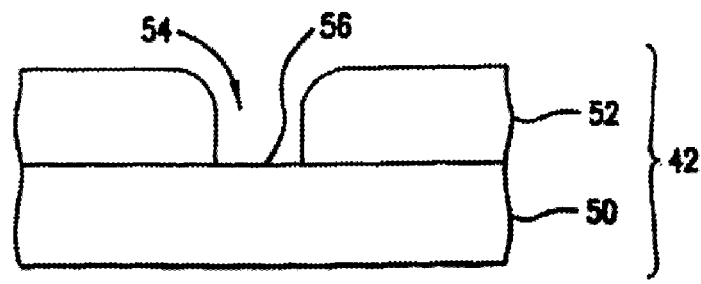
FIG. 3 is a detailed cross-sectional view of a substrate shown above in FIG. 2 before deposition of a first refractory metal layer in accordance with one embodiment of the present invention.

Referring to FIGS. 1 and 3, one or both of processing chambers 12 and 14, discussed above may operate to form, on substrate 42, a contact in accordance with the present invention on substrate 42. To that end, substrate 42 includes a wafer 50 that may be formed from any material suitable for semiconductor processing, such as silicon. One or more layers, shown as layer 52, may be present on wafer 50. Layer 52 may be formed from any suitable material, including dielectric or conductive materials. Layer 52 includes a void 54, exposing a region 56 of substrate 42.

Figure 4:
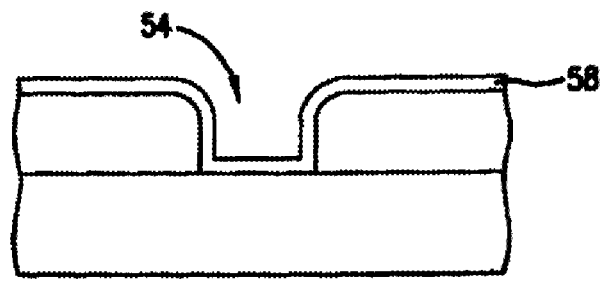
FIG. 4 is a detailed cross-sectional view of the substrate shown above in FIG. 3 after deposition of a first refractory metal layer in accordance with one embodiment of the present invention.

Referring to FIG. 4, formed adjacent to layer 52 and region 54 is a layer containing a refractory metal compound, such as titanium. In the present example, layer 58 is formed from titanium nitride, TiN, by sequentially exposing substrate 42 to processing gases to chemisorb monolayers of differing compounds onto the substrate, discussed more fully below. Layer 58 conforms to the profile of the void 54 so as to cover region 56 and layer 52.

Figure 5:
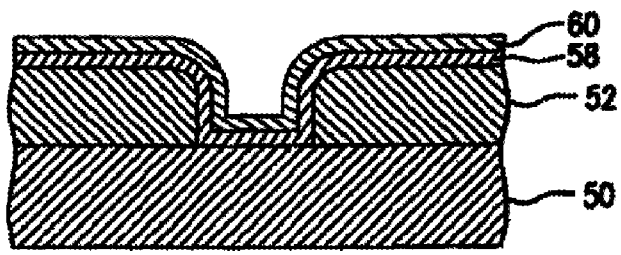
FIG. 5 is a detailed cross-sectional view of a substrate shown above in FIG. 4 after deposition of a second refractory metal layer in accordance with one embodiment of the present invention.

Referring to FIG. 5, adjacent to layer 58 is formed an additional refractory metal layer 60. In the present example, layer 60 is formed from tungsten in the manner discussed above with respect to layer 52, except using different process gases. Layer 60 conforms to the profile of layer 58 and, therefore, conforms to the profile of void 54.

Figure 6:
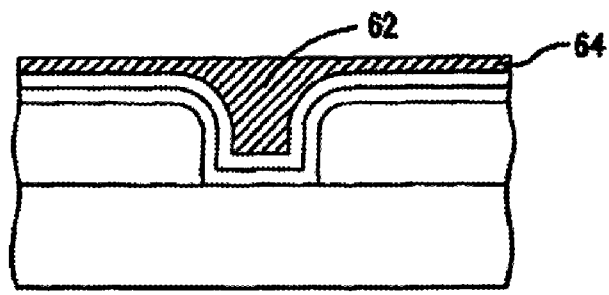
FIG. 6 is a detailed cross-sectional view of a substrate shown above in FIG. 2 after deposition of a copper contact in accordance with one embodiment of the present invention.
Figure 7:
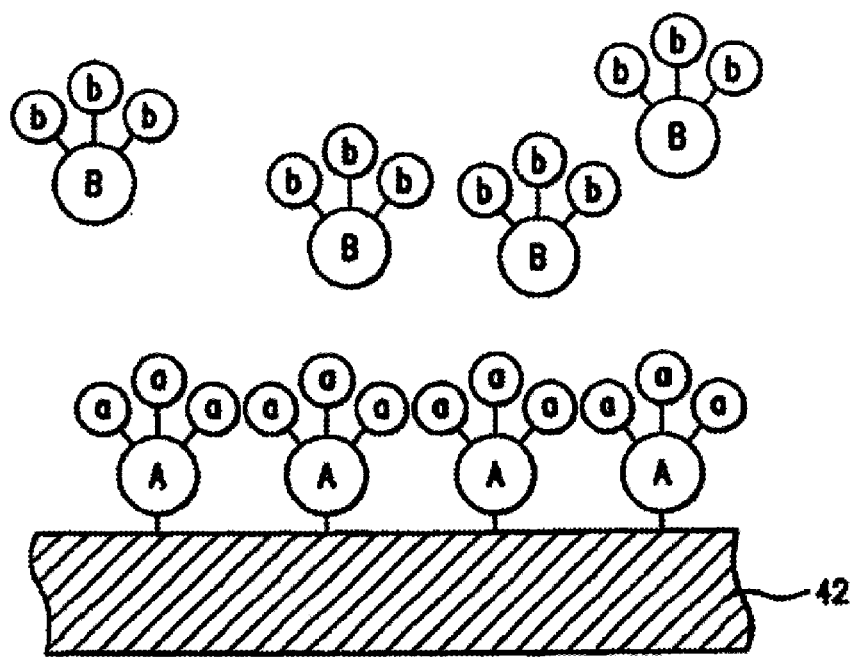
Figure 8:
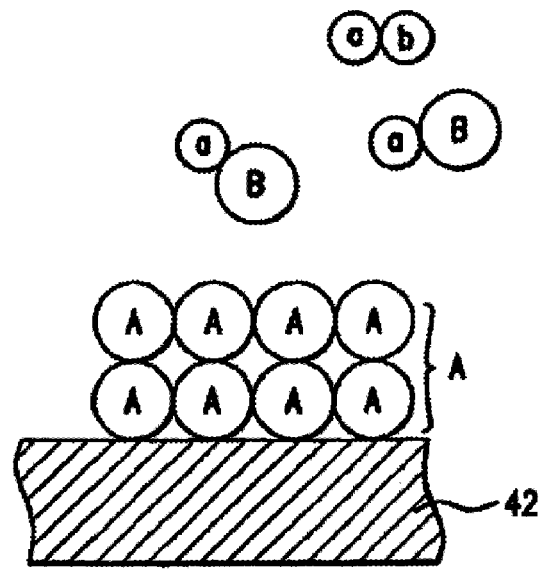

Referring to FIG. 6, shown is one example of a contact 62 formed in void 54 in accordance with the present invention by deposition of a layer of copper 64 that fills void 54, using standard deposition techniques. With this configuration, a stacked barrier layer consisting of TiN layer 58 and W layer 60 surrounds contact 62. TiN layer 58 serves as an adhesion layer to facilitate nucleation and deposition by W layer 60. TiN layer also serves as a diffusion barrier to reduce, if not prevent, diffusion of W into the surrounding environs, such as region 56 and layer 52. W layer 60 serves as a barrier layer for contact 62, thereby preventing copper material from diffusing into or through TiN layer 58 and into the environs surrounding void 54. Employing sequential deposition techniques, such as atomic layer deposition, provides superior thermal and conductive characteristics of the aforementioned stacked barrier layer. Specifically, the sequential deposition techniques described below enable precise control over the thickness of both layers 58 and 60.

Figure 7:
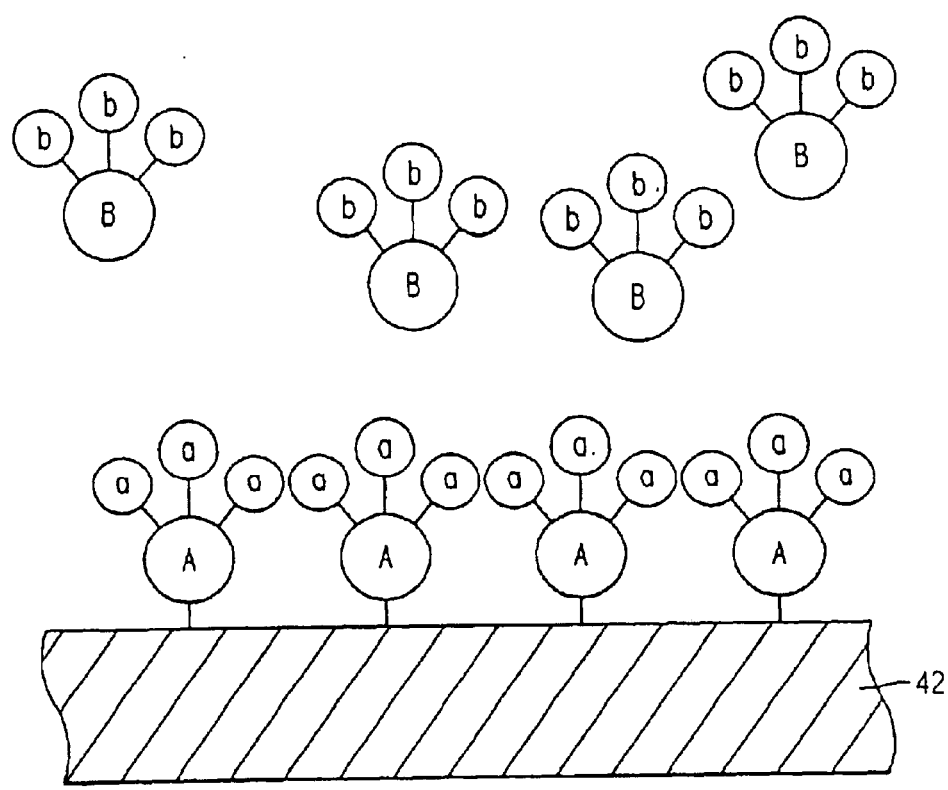
FIG. 7 is a schematic view showing deposition of a first molecule onto a substrate during sequential deposition techniques in accordance with one embodiment of the present invention.

Referring to FIGS. 1, 6 and 7, one or both of processing chambers 12 and 14, discussed above, may operate to deposit layers 58 and 60 on substrate 42 employing sequential deposition techniques. Specifically, the initial surface of substrate 42, e.g., the surface of region 56 and the surface of layer 52, presents an active ligand to the process region. A batch of a first processing gas, in this case $Aa_x$, results in a layer of A being deposited on substrate 42 having a surface of ligand x exposed to the processing chamber 37. Thereafter, a purge gas enters processing chamber 37 to purge the gas $Aa_x$. After purging gas $Aa_x$ from processing chamber 37, a second batch of processing gas, $Bb_y$, is introduced into processing chamber 37. The a ligand present on the substrate surface reacts with the b ligand and B atom, releasing molecules ab and Ba, that move away from substrate 42 and are subsequently pumped from processing chamber 37. In this manner, a surface comprising a monolayer of A atoms remains upon substrate 42 and exposed to processing chamber 37, shown in FIG. 4. The process proceeds cycle after cycle, until the desired thickness is achieved.

Figure 8:
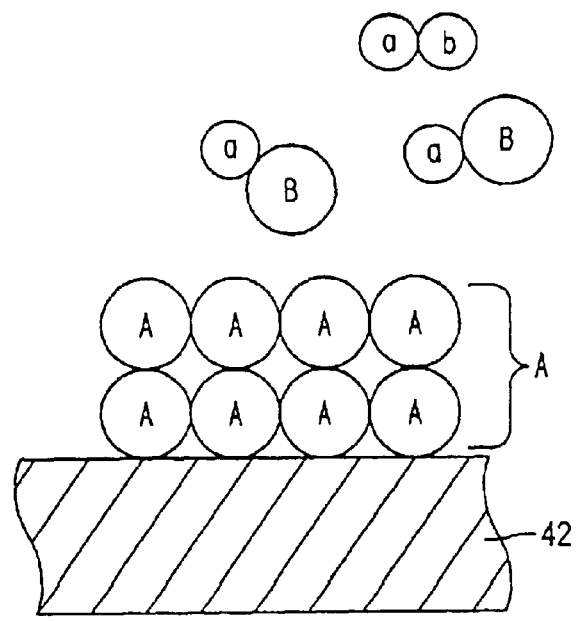
FIG. 8 is a schematic view showing deposition of second molecule onto a substrate during sequential deposition techniques in accordance with one embodiment of the present invention.

Referring to both FIGS. 2 and 8, although any type of processing gas may be employed, in the present example, the processing gas $Aa_x$ is a titanium-containing gas selected from the group that includes TDMAT, TDEAT and $TiCl_4$. The processing gas $Bb_y$ functions as a reducing agent and is selected from the group including $H_2$, $B_2H_6$, $SiH_4$ and $NH_3$. Two purge gases were employed: Ar and $N_2$. Each of the processing gases is flowed into processing chamber 37 with a carrier gas, which in this example, is one of the purge gases. It should be understood, however, that the purge gas may differ from the carrier gas, discussed more fully below. One cycle of the sequential deposition technique in accordance with the present invention includes flowing a purge gas into processing chamber 37 during time $t_1$ before the titanium-containing gas is flowed into processing chamber 37. During time $t_2$, the titanium-containing processing gas is flowed into the processing chamber 37, along with a carrier gas. After $t_2$ has lapsed, the flow of titanium-containing gas terminates and the flow of the carrier gas continues during time $t_3$, purging the processing chamber of the titanium-containing processing gas. During time $t_4$, the processing chamber 37 is pumped so as to remove all gases. After pumping of process chamber 37, a carrier gas is introduced during time $t_5$, after which time the reducing process gas is introduced into the processing chamber 37 along with the carrier gas, during time $t_6$. The flow of the reducing process gas into processing chamber 37 is subsequently terminated. After the flow of reducing process gas into processing chamber 37 terminates, the flow of carrier gas continues, during time $t_7$. Thereafter, processing chamber 37 is pumped so as to remove all gases therein, during time $t_8$, thereby concluding one cycle of the sequential deposition technique in accordance with the present invention. The aforementioned cycle is repeated multiple times until layer 58 reaches a desired thickness. After TiN layer 58 reaches a desired thickness, W layer 60 is deposited adjacent thereto employing sequential deposition techniques.

Figure 10:
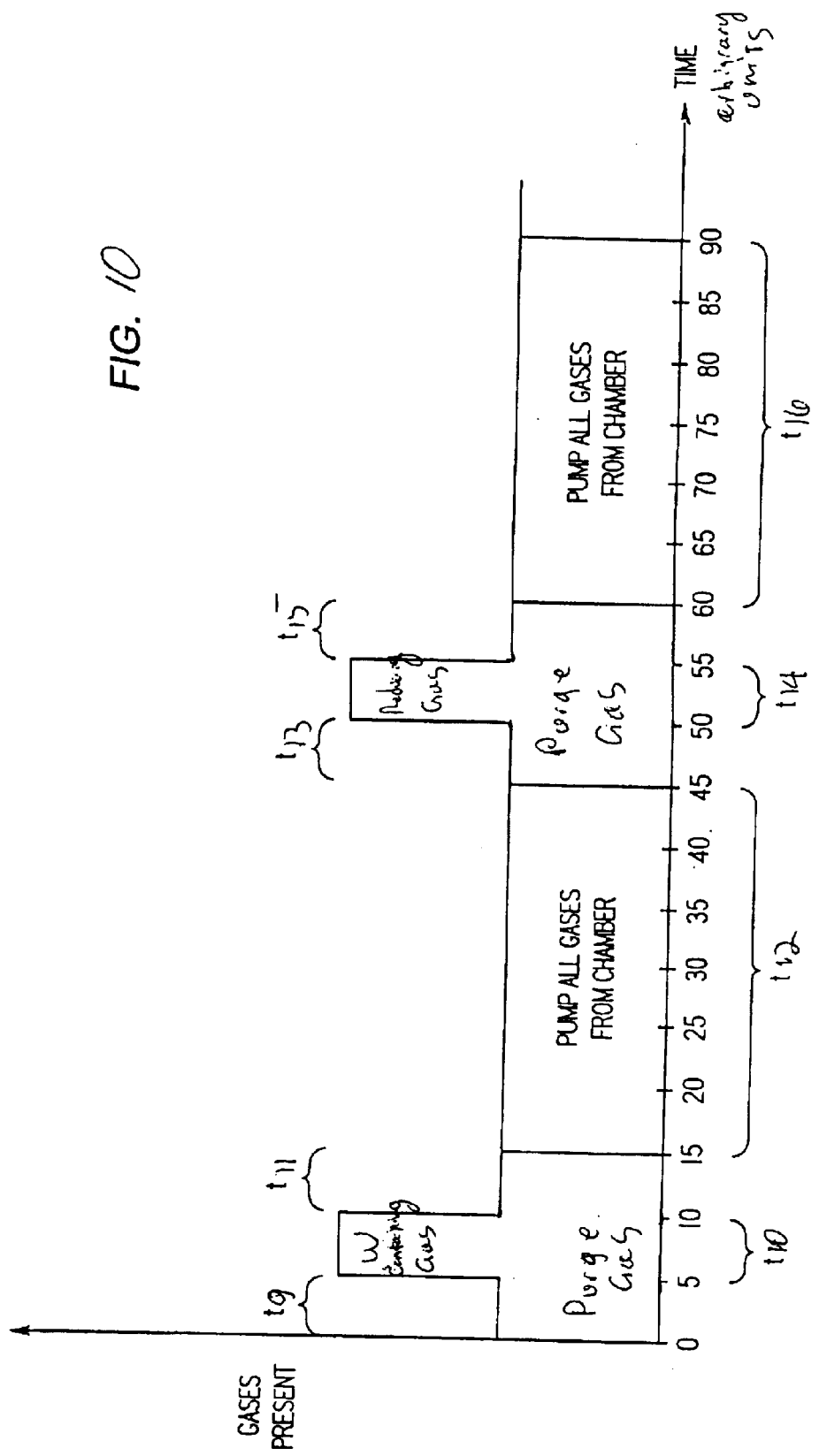
FIG. 10 is a graphical representation showing the concentration of gases introduced into the processing chamber shown above in FIG. 2, and the time in which the gases are present in the processing chamber to deposit the Tungsten layer shown above in FIG. 4, in accordance with one embodiment of the present invention.
Figure 1:
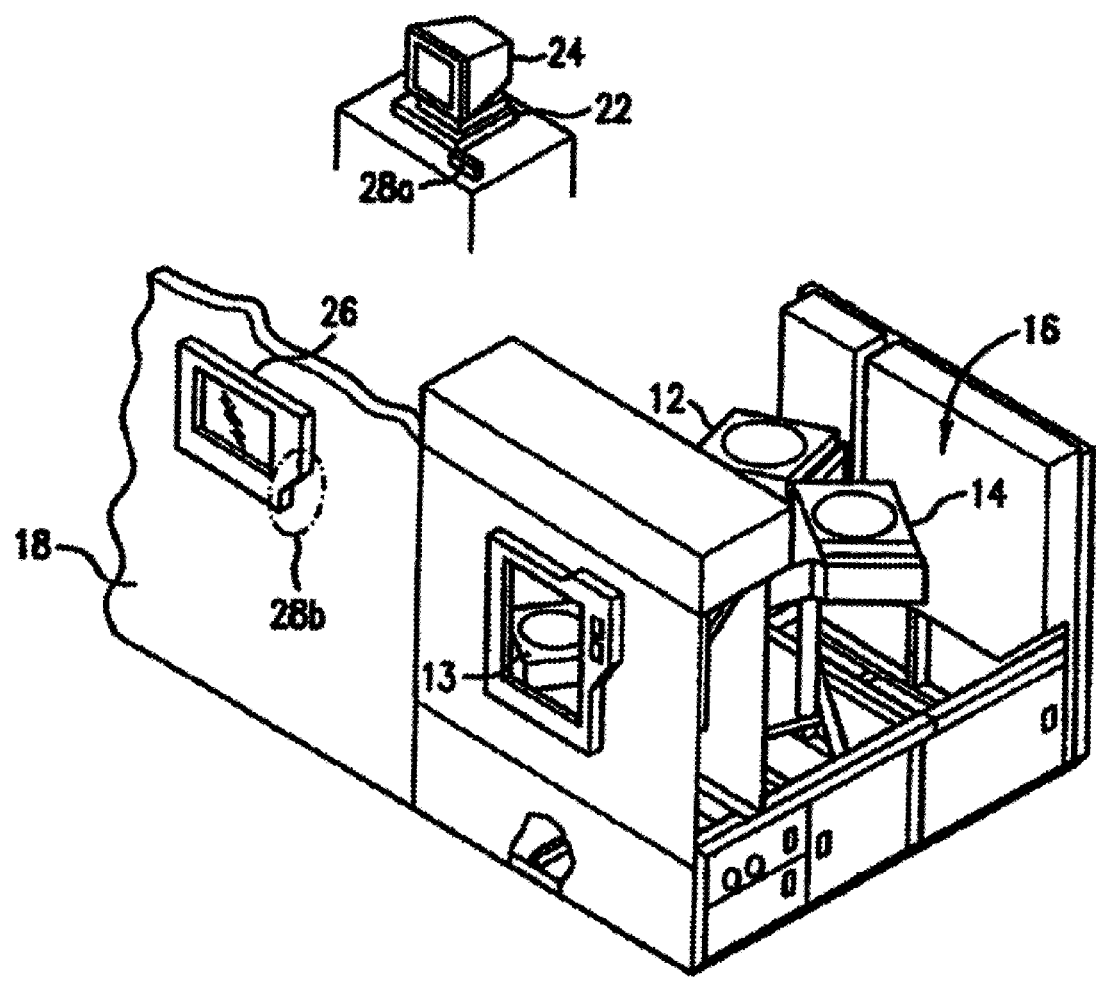
Figure 2:
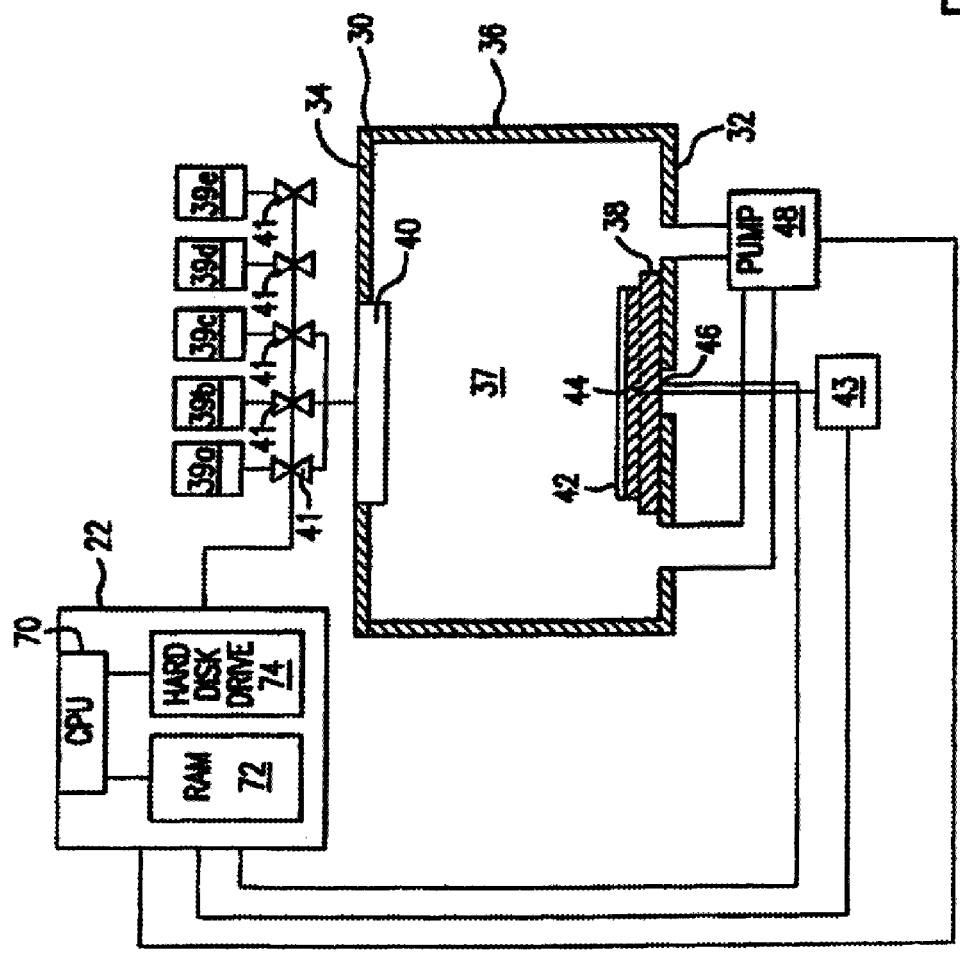

Referring to FIGS. 2 and 10 to form W layer 60, processing gas $Aa_x$ may be any known tungsten-containing gas, such a tungsten hexafluoride, $WF_6$. The processing gas $Bb_y$ functions as a reducing agent and is selected from the group including $SiH_4$, $B_2H_6$ and $NH_3$. The same purge gases may be employed, as discussed above. Each of the processing gases is flowed into the processing chamber 37 with a carrier gas, as discussed above. One cycle of the sequential deposition technique to form W layer 60 in accordance with the present invention includes flowing a purge gas into the processing chamber 37 during time $t_9$, before the tungsten-containing gas is flowed into the processing chamber 37. During time $t_{10}$, the tungsten-containing processing gas is flowed into the processing chamber 37, along with a carrier gas. After time $t_{10}$ has lapsed, the flow of tungsten-containing gas terminates and the flow of the carrier gas continues during time $t_{11}$, purging the processing chamber of the tungsten-containing processing gas. During time $t_{12}$, processing chamber 37 is pumped so as to remove all gases. After pumping of the process chamber 37, a carrier gas is introduced during time $t_{13}$, after which time the reducing process gas is introduced into the processing chamber 37 along with the carrier gas, during time $t_{14}$. The flow of the reducing process gas into processing chamber 37 is subsequently terminated. After the flow of reducing process gas into the processing chamber 37 terminates, the flow of carrier continues during time $t_{15}$. Thereafter, the processing chamber 37 is pumped so as to remove all gases therein, during time $t_{16}$, thereby concluding one cycle of the sequential deposition technique in accordance with the present invention. The aforementioned cycle is repeated multiple times until layer 60 reaches a desired thickness. After W layer 60 reaches a desired thickness, the contact 62, shown in FIG. 6 may be deposited employing known techniques.

The benefits of employing sequential deposition are manifold, including flux-independence of layer formation that provides uniformity of deposition independent of the size of a substrate. For example, the measured difference of the layer uniformity and thickness measured between of 200 mm substrate and a 300 mm substrate deposited in the same chamber is negligible. This is due to the self-limiting characteristics of chemisorption. Further, the chemisorption characteristics contribute to near-perfect step coverage over complex topography.

In addition, the thickness of the layers 58 and 60 may be easily controlled while minimizing the resistance of the same by employing sequential deposition techniques. In one example of the present invention, layers 58 and 60, as well as contact 62 may be deposited in a common processing chamber, for example chambers 12 and 14. To provide added flexibility when depositing layers 58 and 60, as well as contact 62, a bifurcated deposition process may be practiced in which layer 58 is deposited in one process chamber, for example chamber 12, and layer 60 is deposited in a separate chamber, for example chamber 14. This may reduce the deposition time of each of layers 58 and 60 by, inter alia, having each processing chamber 12 and 14 preset to carry-out the process parameters necessary to deposit the requisite refractory metal layers.

Referring again to FIG. 2, the process for depositing the tungsten layer may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, Fortran, and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled Windows® library routines. To execute the linked and compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted. Further, the sequence of gases may utilize a different initial sequence. For example, the initial sequence may include exposing the substrate to the reducing gas before the metal-containing gas is introduced into the processing chamber. In addition, other stacked layers may be deposited, in addition to the refractory-metal layers described above and for purposes other than formation of a barrier layer. Therefore, the scope of the invention should not be based upon the foregoing description. Rather, the scope of the invention should be determined based upon the claims recited herein, including the full scope of equivalents thereof.

What is claimed is:

1. A method for forming a stacked barrier layer on a substrate disposed in a processing chamber, comprising:
    serially exposing said substrate to first and second reactive gases to form an adhesion layer; and
    serially exposing said adhesion layer to third and fourth reactive gases to form a barrier layer adjacent to said adhesion layer.

2. The method as recited in claim 1 further including depositing a layer of copper adjacent to said barrier layer.

3. The method as recited in claim 1 further including repeating serially exposing said substrate to first and second reactive gases to form said adhesion layer to a desired thickness before serially exposing said adhesion layer to third and fourth reactive gases.

4. The method as recited in claim 3 further including repeating serially exposing said substrate to third and fourth reactive gases to form said barrier layer to a desired thickness after serially exposing said substrate to first and second reactive gases.

5. The method as recited in claim 1 further including providing first and second processing chambers wherein serially exposing said substrate to first and second reactive gases further includes serially exposing said substrate to said first and second reactive gases while said substrate is disposed in said first processing chamber and serially exposing said adhesion layer to third and fourth reactive gases further includes serially exposing said adhesion layer to third and fourth reactive gases while said substrate is positioned in said second processing chamber.

6. The method as recited in claim 3 further including providing first and second processing chambers wherein serially exposing said substrate to first and second reactive gases further includes serially exposing said substrate to said first and second reactive gases while said substrate is disposed in said first processing chamber and serially exposing said adhesion layer to third and fourth reactive gases further includes serially exposing said adhesion layer to third and fourth reactive gases while said substrate is positioned in said first processing chamber and depositing a layer of copper adjacent to said barrier layer further includes depositing a copper layer adjacent to said barrier layer when said substrate is positioned in said second processing chamber.

7. The method as recited in claim 1 further including providing first, second and third processing chambers wherein serially exposing said substrate to first and second reactive gases further includes serially exposing said substrate to said first and second reactive gases while said substrate is disposed in said first processing chamber and serially exposing said adhesion layer to third and fourth reactive gases further includes serially exposing said adhesion layer to third and fourth reactive gases while said substrate is positioned in said second processing chamber and depositing a layer of copper adjacent to said barrier layer further includes depositing a copper layer adjacent to said barrier layer when said substrate is positioned in said third processing chamber.

8. The method as recited in claim 1 wherein serially exposing said substrate further includes introducing said second reactive gas into said processing chamber and further including purging said processing chamber of said second reactive gas before exposing said adhesion layer to said third reactive gas.

9. The method as recited in claim 1 wherein said first and third gases each includes a refractory metal compound, with the refractory metal compound associated with said first reactive gas differing the refractory metal compound associated with said third reactive gas.

10. The method as recited in claim 1 wherein said first reactive gas is selected from the group consisting of TDMAT, TDEAT and $TiCl_4$ and said second reactive gas is selected from the group consisting of $H_2$, $B_2H_6$, $SiH_4$ and $NH_3$.

11. The method as recited in claim 1 wherein said third reactive gas is $WF_6$ and said fourth reactive gas is selected from the group consisting of $SiH_4$, $B_2H_6$ and $NH_3$.

12. The method as recited in claim 1 further comprising purging said processing chamber of said first reactive gas before introducing said second reactive gas by introducing a purge gas into said processing chamber after exposing said substrate to said first reactive gas and before exposing said substrate to said second reactive gas.

13. The method as recited in claim 1 further comprising purging said processing chamber of said first reactive gas before introducing said second reactive gas by pumping said processing chamber clear of said first reactive gas before introducing said second reactive gas.

14. The method as recited in claim 1 further comprising purging said processing chamber of said third reactive gas before introducing said fourth reactive gas by introducing a purge gas into said processing chamber after exposing said substrate to said third reactive gas and before exposing said substrate to said fourth reactive gas.

15. The method as recited in claim 1 further comprising purging said processing chamber of said third reactive gas before introducing said fourth reactive gas by pumping said processing chamber clear of said third reactive gas before introducing said fourth reactive gas.

16. A method for forming a stacked barrier layer on a substrate disposed in a processing chamber, said method comprising:
  serially exposing said substrate to first and second reactive gases to form an adhesion layer by introducing said first reactive gas into said processing chamber and removing said first reactive gas from said processing chamber before introducing said second reactive gas;
  repeating serially exposing said substrate to first and second reactive gases to form said adhesion layer to a desired thickness;
  serially exposing said adhesion layer to third and fourth reactive gases to form a barrier layer adjacent to said adhesion layer by introducing said third reactive gas into said processing chamber and clearing said third reactive gas from said processing chamber before introducing said fourth reactive gas;
  repeating serially exposing said substrate to third and fourth reactive gases to form said barrier layer to an acceptable thickness;
  purging said processing chamber of said first and second reactive gases before introducing either of said third and fourth reactive gases; and
  depositing a layer of copper adjacent to said barrier layer.

17. The method as recited in claim 16 wherein said first reactive gas is selected from the group consisting of TDMAT, TDEAT and $TiCl_4$, said second reactive gas is selected from the group consisting of $H_2$, $B_2H_6$, $SiH_4$ and $NH_3$, said third reactive gas is $WF_6$, and said fourth reactive gas is selected from the group consisting of $SiH_4$, $B_2H_6$ and $NH_3$.

18. The method as recited in claim 16 further comprising removing said first reactive gas from said processing chamber before introducing said second reactive gas by introducing an inert gas into said processing chamber, and clearing said third reactive gas from said processing chamber before introducing said fourth reactive gas by introducing an expulsion gas into said processing chamber.

19. The method as recited in claim 16 further comprising removing said first reactive gas from said processing chamber before introducing said second reactive gas by pumping said processing chamber clear of said first reactive gas, and clearing said third reactive gas from said processing chamber by pumping said processing chamber clear of said third reactive gas.

20. A method for forming a stacked barrier layer on a substrate surface, comprising:
  exposing the substrate surface to a first reactive gas;
  exposing the substrate surface to a second reactive gas;
  sequentially repeating the exposure to the first and second reactive gases until an adhesion layer having a desired thickness is formed;
  exposing the substrate surface to a third reactive gas;
  exposing the substrate surface to a fourth reactive gas; and then
  sequentially repeating the exposure to the third and fourth reactive gases until a barrier layer having a desired thickness is formed over the adhesion layer.

21. The method of claim 20, wherein the first reactive gas comprises a refractory metal-containing compound.

22. The method of claim 21, wherein the refractory metal-containing compound comprises TDMAT, TDEAT, $TiCl_4$, or combinations thereof.

23. The method of claim 21, wherein the second precursor gas comprises a reducing compound.

24. The method of claim 23, wherein the reducing compound comprises $H_2$, $B_2H_6$, $SiH_4$, $NH_3$, or combinations thereof.

25. The method of claim 21, wherein the third precursor gas comprises a refractory metal-containing compound.

26. The method of claim 25, wherein the refractory metal-containing compound comprises tungsten.

27. The method of claim 21, wherein the fourth comprises a reducing compound.

28. The method of claim 27, wherein the reducing compound comprises $SiH_4$, $B_2H_6$, $NH_3$, or combinations thereof.

29. The method of claim 20, further comprising depositing copper at least partially over the barrier layer.

30. The method of claim 20, wherein the adhesion layer is deposited within a first processing chamber.

31. The method of claim 30, wherein the barrier layer is deposited within a second processing chamber.

32. The method of claim 31, wherein the copper is deposited in a third processing chamber.

33. The method of claim 32, wherein the first, second and third processing chambers are each disposed about a common mainframe.

34. The method of claim 30, wherein the adhesion layer and the barrier layer are both deposited in the first chamber.

35. A method for depositing a barrier layer on a substrate surface, comprising:

sequentially exposing the substrate surface to a first refractory metal-containing compound and a first reducing compound; and sequentially exposing the substrate surface to a second refractory metal-containing compound and a second reducing compound to form the barrier layer.

36. The method of claim 35, wherein the first refractory metal-containing compound comprises TDMAT, TDEAT, $TiCl_4$, or combinations thereof.

37. The method of claim 35, wherein the second refractory metal-containing compound comprises tungsten.

38. The method of claim 35, wherein the first and second reducing compounds is selected from a group consisting of $SiH_4$, $B_2H_6$, $NH_3$, and combinations thereof.

39. The method of claim 35, wherein the barrier layer comprises titanium, titanium nitride, tungsten, tungsten nitride, or combinations thereof.

40. The method of claim 35, wherein the adhesion layer is deposited within a first processing chamber and the barrier layer is deposited within a second processing chamber.

41. The method of claim 35, further comprising depositing copper at least partially over the barrier layer.

42. The method of claim 41, wherein the adhesion layer is deposited within a first processing chamber and the barrier layer is deposited within a second processing chamber.

43. The method of claim 42, wherein the copper is deposited in a third processing chamber and the first, second and third processing chambers are each disposed about a common mainframe.

44. The method of claim 42, wherein the adhesion layer and the barrier layer are both deposited in the first chamber.

45. A method for forming a metal contact on a substrate surface, comprising:

sequentially exposing the substrate surface to a titanium-containing compound and a nitrogen-containing compound to form an adhesion layer comprising titanium nitride;

sequentially exposing the substrate surface to a tungsten-containing compound and a reducing compound to form a barrier layer comprising tungsten; and depositing copper at least partially over the barrier layer to form the metal contact.

46. The method of claim 45, wherein the tungsten-containing compound comprises TDMAT, TDEAT, $TiCl_4$, or combinations thereof.

47. The method of claim 45, wherein the reducing compound is selected from a group consisting of $SiH_4$, $B_2H_6$, $NH_3$, and combinations thereof.

48. The method of claim 45, wherein the adhesion layer is deposited within a first processing chamber and the barrier layer is deposited within a second processing chamber.

49. The method of claim 48, wherein the copper is deposited in a third processing chamber and the first, second and third processing chambers are each disposed about a common mainframe.

* * * * *

UNITED STATES PATENT AND TRADEMARK OFFICE
CERTIFICATE OF CORRECTION

| | | |
|---|---|---|
| PATENT NO. | : 6,849,545 B2 | Page 1 of 18 |
| APPLICATION NO. | : 09/885609 | |
| DATED | : February 1, 2005 | |
| INVENTOR(S) | : Mak et al. | |

It is certified that error appears in the above-identified patent and that said Letters Patent is hereby corrected as shown below:

Please delete entire patent title pages, drawings 1-6, and columns 1 line 1 and columns 10 line 32

And insert title pages, drawings 1–6, and columns 1 line 1 and columns 10 line 32 as shown on the attached pages.

Signed and Sealed this

Sixth Day of May, 2008

JON W. DUDAS
*Director of the United States Patent and Trademark Office*

(12) United States Patent
Mak et al.

(10) Patent No.: US 6,849,545 B2
(45) Date of Patent: Feb. 1, 2005

(54) SYSTEM AND METHOD TO FORM A COMPOSITE FILM STACK UTILIZING SEQUENTIAL DEPOSITION TECHNIQUES

(75) Inventors: Alfred W. Mak, Union City, CA (US); Mei Chang, Saratoga, CA (US); Jeong Soo Byun, Cupertino, CA (US); Hua Chung, San Jose, CA (US); Ashok Sinha, Palo Alto, CA (US); Moris Kori, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/885,609

(22) Filed: Jun. 20, 2001

(65) Prior Publication Data
US 2002/0197863 A1 Dec. 26, 2002

(51) Int. Cl.$^7$ ............................................. H01L 21/44
(52) U.S. Cl. ................... 438/679; 438/769; 438/775; 438/770; 438/685; 438/683; 438/682; 257/751; 427/255.2
(58) Field of Search .................................. 438/679, 627, 438/644, 654, 682, 683, 685, 769, 770, 775

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,486,487 A | 12/1984 | Skarp | 428/216 |
| 4,767,494 A | 8/1988 | Kobayashi et al. | |
| 4,806,321 A | 2/1989 | Nishizawa et al. | |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | |
| 4,845,049 A | 7/1989 | Sunakawa | |
| 4,859,625 A | 8/1989 | Nishizawa et al. | 437/81 |
| 4,859,627 A | 8/1989 | Sunakawa | |
| 4,861,417 A | 8/1989 | Mochizuki et al. | |
| 4,876,218 A | 10/1989 | Pessa et al. | |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | |

(List continued on next page.)

FOREIGN PATENT DOCUMENTS

| | | |
|---|---|---|
| DE | 196 27 017 | 1/1997 |
| DE | 198 20 147 | 7/1999 |
| EP | 0 344 352 A1 | 12/1989 |

(List continued on next page.)

OTHER PUBLICATIONS

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016–2020.

(List continued on next page.)

*Primary Examiner*—David Nelms
*Assistant Examiner*—Renee R. Berry
(74) *Attorney, Agent, or Firm*—Moser, Patterson & Sheridan

(57) ABSTRACT

A system and method to form a stacked barrier layer for copper contacts formed on a substrate. The substrate is serially exposed to first and second reactive gases to form an adhesion layer. Then, the adhesion layer is serially exposed to third and fourth reactive gases to form a barrier layer adjacent to the adhesion layer. This is followed by deposition of a copper layer adjacent to the barrier layer.

49 Claims, 6 Drawing Sheets

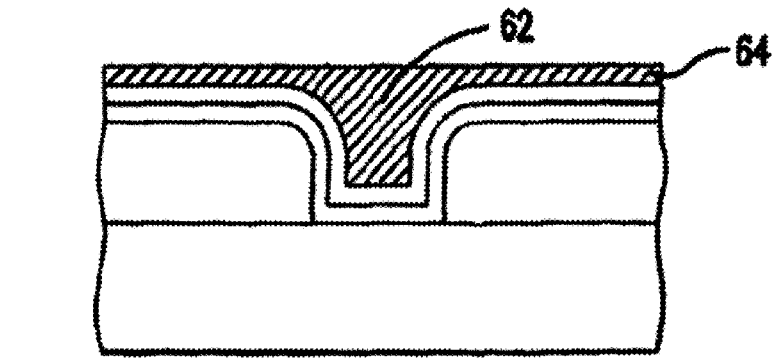

U.S. PATENT DOCUMENTS

| Patent No. | Date | Inventor(s) | Class |
|---|---|---|---|
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | |
| 5,166,092 A | 11/1992 | Mochizuki et al. | |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | |
| 5,254,207 A | 10/1993 | Nishizawa et al. | 156/601 |
| 5,256,244 A | 10/1993 | Ackerman | |
| 5,259,881 A | 11/1993 | Edwards et al. | 118/719 |
| 5,270,247 A | 12/1993 | Sakuma et al. | |
| 5,278,435 A | 1/1994 | Van Hove et al. | |
| 5,281,274 A | 1/1994 | Yoder | |
| 5,286,296 A | 2/1994 | Sato et al. | 118/719 |
| 5,290,748 A | 3/1994 | Knuuttila et al. | |
| 5,294,286 A | 3/1994 | Nishizawa et al. | |
| 5,296,403 A | 3/1994 | Nishizawa et al. | 437/133 |
| 5,300,186 A | 4/1994 | Kitahara et al. | |
| 5,306,666 A | 4/1994 | Izumi | 437/192 |
| 5,311,055 A | 5/1994 | Goodman et al. | 257/593 |
| 5,316,615 A | 5/1994 | Copel | 117/95 |
| 5,316,793 A | 5/1994 | Wallace et al. | |
| 5,330,610 A | 7/1994 | Eres et al. | |
| 5,336,324 A | 8/1994 | Stall et al. | |
| 5,338,389 A | 8/1994 | Nishizawa et al. | |
| 5,348,911 A | 9/1994 | Jurgensen et al. | 117/91 |
| 5,374,570 A | 12/1994 | Nasu et al. | |
| 5,393,565 A | 2/1995 | Suzuki et al. | 427/255.2 |
| 5,395,791 A | 3/1995 | Cheng et al. | |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | |
| 5,443,647 A | 8/1995 | Aucoin et al. | |
| 5,455,072 A | 10/1995 | Bension et al. | 427/255.7 |
| 5,458,084 A | 10/1995 | Thorne et al. | |
| 5,469,806 A | 11/1995 | Mochizuki et al. | 117/97 |
| 5,480,818 A | 1/1996 | Matsumoto et al. | |
| 5,483,919 A | 1/1996 | Yokoyama et al. | |
| 5,484,664 A | 1/1996 | Kitahara et al. | |
| 5,503,875 A | 4/1996 | Imai et al. | 427/255.3 |
| 5,521,126 A | 5/1996 | Okamura et al. | 437/235 |
| 5,526,244 A | 6/1996 | Bishop | 362/147 |
| 5,527,733 A | 6/1996 | Nishizawa et al. | 437/160 |
| 5,532,511 A | 7/1996 | Nishizawa et al. | |
| 5,540,783 A | 7/1996 | Eres et al. | 118/725 |
| 5,580,380 A | 12/1996 | Liu et al. | |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | |
| 5,695,564 A | 12/1997 | Imahashi | 118/719 |
| 5,705,224 A | 1/1998 | Murota et al. | |
| 5,707,880 A | 1/1998 | Aftergut et al. | 437/3 |
| 5,711,811 A | 1/1998 | Suntola et al. | |
| 5,730,801 A | 3/1998 | Tepman et al. | 118/719 |
| 5,730,802 A | 3/1998 | Ishizumi et al. | |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,804,488 A | 9/1998 | Shih et al. | |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,851,849 A | 12/1998 | Comizzoli et al. | |
| 5,855,675 A | 1/1999 | Doering et al. | 118/719 |
| 5,855,680 A | 1/1999 | Soininen et al. | |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | |
| 5,879,459 A | 3/1999 | Gadgil et al. | |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,942,799 A | 8/1999 | Danek et al. | 257/751 |
| 5,947,710 A | 9/1999 | Cooper et al. | 418/63 |
| 5,972,179 A | 10/1999 | Chittipeddi et al. | 204/192.17 |
| 5,972,430 A | 10/1999 | DiMeo, Jr. et al. | 427/255.32 |
| 5,989,623 A | 11/1999 | Chen et al. | 427/97 |
| 6,001,669 A | 12/1999 | Gaines et al. | 438/102 |
| 6,015,590 A | 3/2000 | Suntola et al. | |
| 6,025,627 A | 2/2000 | Forbes et al. | |
| 6,036,773 A | 3/2000 | Wang et al. | |
| 6,042,652 A | 3/2000 | Hyun et al. | 117/719 |
| 6,043,177 A | 3/2000 | Falconer et al. | |
| 6,051,286 A | 4/2000 | Zhao et al. | 427/576 |
| 6,062,798 A | 5/2000 | Muka | 414/416 |
| 6,071,808 A | 6/2000 | Merchant et al. | |
| 6,084,302 A | 7/2000 | Sandhu | |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | |
| 6,117,244 A | 9/2000 | Bang et al. | 118/715 |
| 6,124,158 A | 9/2000 | Dautartas et al. | |
| 6,130,147 A | 10/2000 | Major et al. | |
| 6,139,700 A | 10/2000 | Kang et al. | 204/192.17 |
| 6,140,237 A | 10/2000 | Chan et al. | |
| 6,140,238 A | 10/2000 | Kitch | |
| 6,143,659 A | 11/2000 | Leem | 438/688 |
| 6,144,060 A | 11/2000 | Park | |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,207,487 B1 | 3/2001 | Kim et al. | 438/238 |
| 6,218,298 B1 | 4/2001 | Hoinkis | |
| 6,231,672 B1 | 5/2001 | Choi et al. | 118/715 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |
| 6,284,646 B1 | 9/2001 | Leem | 438/629 |
| 6,287,965 B1 | 9/2001 | Kang et al. | 438/648 |
| 6,291,876 B1 | 9/2001 | Stumborg et al. | 257/632 |

| Patent/Publication No. | Date | Inventor(s) | Class |
|---|---|---|---|
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 6,333,260 B1 | 12/2001 | Kwon et al. | 438/643 |
| 6,335,280 B1 | 1/2002 | van der Jeugd | |
| 6,342,277 B1 | 1/2002 | Sherman | 427/562 |
| 6,348,376 B2 | 2/2002 | Lim et al. | 438/253 |
| 6,355,561 B1 | 3/2002 | Sandhu et al. | 438/676 |
| 6,358,829 B2 | 3/2002 | Yoon et al. | 438/597 |
| 6,368,954 B1 | 4/2002 | Lopatin et al. | 438/627 |
| 6,369,430 B1 | 4/2002 | Adetutu et al. | 257/382 |
| 6,372,598 B2 | 4/2002 | Kang et al. | 438/399 |
| 6,391,785 B1 | 5/2002 | Satta et al. | 438/704 |
| 6,399,491 B2 | 6/2002 | Jeon et al. | 438/680 |
| 6,416,577 B1 | 7/2002 | Suntoloa et al. | 117/88 |
| 6,420,189 B1 | 7/2002 | Lopatin | 438/2 |
| 6,423,619 B1 | 7/2002 | Grant et al. | 438/589 |
| 6,432,821 B1 | 8/2002 | Dubin et al. | 438/678 |
| 6,447,607 B2 | 9/2002 | Soininen et al. | 117/200 |
| 6,447,933 B1 | 9/2002 | Wang et al. | 428/635 |
| 6,451,119 B2 | 9/2002 | Sneh et al. | 118/715 |
| 6,451,695 B2 | 9/2002 | Sneh | 438/685 |
| 6,455,421 B1 | 9/2002 | Itoh et al. | 438/656 |
| 6,458,701 B1 | 10/2002 | Chae et al. | 438/680 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,262 B1 | 11/2002 | Elers et al. | 117/84 |
| 6,482,733 B2 | 11/2002 | Raaijmakers et al. | 438/633 |
| 6,482,740 B2 | 11/2002 | Soininen et al. | 438/686 |
| 6,495,449 B1 | 12/2002 | Nguyen | 438/627 |
| 6,511,539 B1 | 1/2003 | Raaijmakers et al. | 117/102 |
| 6,534,395 B2 | 3/2003 | Werkhoven et al. | 438/627 |
| 6,548,424 B2 | 4/2003 | Putkonen | 438/785 |
| 6,551,929 B1 | 4/2003 | Kori et al. | |
| 6,599,572 B2 | 7/2003 | Saanila et al. | |
| 6,607,976 B2 | 8/2003 | Chen et al. | |
| 6,632,279 B1 | 10/2003 | Ritala et al. | |
| 6,686,271 B2 | 2/2004 | Raaijmakers et al. | |
| 2001/0000866 A1 | 5/2001 | Sneh et al. | 118/723 R |
| 2001/0003280 A1 | 5/2001 | Sneh | 427/255.28 |
| 2001/0009140 A1 | 7/2001 | Bondestam et al. | 118/725 |
| 2001/0009695 A1 | 7/2001 | Saanila et al. | 427/255.39 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0028924 A1 | 10/2001 | Sherman | 365/200 |
| 2001/0029094 A1 | 10/2001 | Mee-young et al. | 438/597 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0050039 A1 | 12/2001 | Park | 117/102 |
| 2001/0054377 A1 | 12/2001 | Lindfors et al. | 117/104 |
| 2001/0054730 A1 | 12/2001 | Kim et al. | 257/301 |
| 2001/0054769 A1 | 12/2001 | Raaijmakers et al. | 257/758 |
| 2002/0000196 A1 | 1/2002 | Park | 118/715 |
| 2002/0000598 A1 | 1/2002 | Kim et al. | 257/301 |
| 2002/0004293 A1 | 1/2002 | Soininen et al. | 438/584 |
| 2002/0007790 A1 | 1/2002 | Park | 118/715 |
| 2002/0019121 A1 | 2/2002 | Pyo | 438/618 |
| 2002/0021544 A1 | 2/2002 | Cho et al. | 361/200 |
| 2002/0031618 A1 | 3/2002 | Sherman | 427/569 |
| 2002/0037630 A1 | 3/2002 | Agarwal et al. | 438/430 |
| 2002/0041931 A1 | 4/2002 | Suntola et al. | 427/255.28 |
| 2002/0048635 A1 | 4/2002 | Kim et al. | 427/331 |
| 2002/0048880 A1 | 4/2002 | Lee | 438/253 |
| 2002/0052097 A1 | 5/2002 | Park | 438/507 |
| 2002/0055235 A1 | 5/2002 | Agarwal et al. | 438/430 |
| 2002/0061612 A1 | 5/2002 | Sandhu et al. | 438/151 |
| 2002/0074588 A1 | 6/2002 | Lee | 257/306 |
| 2002/0076507 A1 | 6/2002 | Chiang et al. | 427/569 |
| 2002/0076837 A1 | 6/2002 | Hujanen et al. | 438/3 |
| 2002/0081844 A1 | 6/2002 | Jeon et al. | 438/680 |
| 2002/0086106 A1 | 7/2002 | Park et al. | 427/248.1 |
| 2002/0086111 A1 | 7/2002 | Byun et al. | |
| 2002/0086507 A1 | 7/2002 | Park et al. | 438/585 |
| 2002/0090829 A1 | 7/2002 | Sandhu | 438/761 |
| 2002/0092471 A1 | 7/2002 | Kang et al. | 118/715 |
| 2002/0094689 A1 | 7/2002 | Park | 438/694 |
| 2002/0105088 A1 | 8/2002 | Yang et al. | 257/774 |
| 2002/0106536 A1 | 8/2002 | Lee et al. | 428/702 |
| 2002/0106846 A1 | 8/2002 | Seutter et al. | 438/200 |
| 2002/0108570 A1 | 8/2002 | Lindfors | 118/715 |
| 2002/0109168 A1 | 8/2002 | Kim et al. | 257/295 |
| 2002/0117399 A1 | 8/2002 | Chen et al. | 205/125 |
| 2002/0121241 A1 | 9/2002 | Nguyen et al. | |
| 2002/0121342 A1 | 9/2002 | Nguyen et al. | |
| 2002/0121697 A1 | 9/2002 | Marsh | 257/751 |
| 2002/0134307 A1 | 9/2002 | Choi | 118/715 |
| 2002/0135071 A1 | 9/2002 | Kang et al. | 257/767 |
| 2002/0155722 A1 | 10/2002 | Satta et al. | 438/704 |
| 2002/0162506 A1 | 11/2002 | Sneh et al. | 118/715 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0190168 A1 | 12/2002 | Hall et al. | 248/188.7 |
| 2003/0013300 A1 | 1/2003 | Byun | |
| 2003/0013320 A1 | 1/2003 | Kim et al. | 438/778 |
| 2003/0031807 A1 | 2/2003 | Elers et al. | 427/569 |
| 2003/0032281 A1 | 2/2003 | Werkhoven et al. | 438/640 |
| 2003/0049942 A1 | 3/2003 | Haukka et al. | 438/778 |
| 2003/0054631 A1 | 3/2003 | Raaijmakers et al. | |
| 2003/0072975 A1 | 4/2003 | Shero et al. | 428/704 |
| 2003/0082300 A1 | 5/2003 | Todd et al. | 427/255.27 |
| 2003/0089308 A1 | 5/2003 | Raaijmakers | |
| 2003/0101927 A1 | 6/2003 | Raaijmakers | |
| 2003/0104126 A1 | 6/2003 | Fang et al. | |
| 2003/0129826 A1 | 7/2003 | Werkhoven et al. | |
| 2003/0134508 A1 | 7/2003 | Raaijmakers et al. | |
| 2003/0143839 A1 | 7/2003 | Raaijmakers et al. | |
| 2003/0143841 A1 | 7/2003 | Yang et al. | |
| 2003/0165615 A1 | 9/2003 | Aaltonen et al. | |
| 2003/0168750 A1 | 9/2003 | Basceri et al. | |
| 2003/0173586 A1 | 9/2003 | Moriwaki et al. | |
| 2003/0186495 A1 | 10/2003 | Saanila et al. | |
| 2003/0205729 A1 | 11/2003 | Basceri et al. | |

FOREIGN PATENT DOCUMENTS

| | | |
|---|---|---|
| EP | 0 429 270 A2 | 5/1991 |
| EP | 0 442 490 A1 | 8/1991 |
| EP | 0799641 | 10/1997 |
| EP | 1 167 569 | 1/2002 |
| FR | 2 626 110 | 7/1989 |
| FR | 2 692 597 | 12/1993 |
| GB | 2 355 727 | 5/2001 |
| GB | 2355747 | 5/2001 |
| JP | 58-098917 | 6/1983 |
| JP | 58-100419 | 6/1983 |
| JP | 60-065712 A | 4/1985 |
| JP | 61-035847 | 2/1986 |
| JP | 61-210623 | 9/1986 |
| JP | 62-069508 | 3/1987 |
| JP | 62-091495 A | 4/1987 |
| JP | 62-141717 | 6/1987 |
| JP | 62-167297 | 7/1987 |
| JP | 62-171999 | 7/1987 |
| JP | 62-232919 | 10/1987 |

| | | | | | |
|---|---|---|---|---|---|
| JP | 63-062313 | 3/1988 | JP | 04-151822 | 5/1992 |
| JP | 63-085098 | 4/1988 | JP | 04-162418 | 6/1992 |
| JP | 63-090833 | 4/1988 | JP | 04-175299 | 6/1992 |
| JP | 63-222420 | 9/1988 | JP | 04-186824 | 7/1992 |
| JP | 63-222421 | 9/1988 | JP | 04-212411 | 8/1992 |
| JP | 63-227007 | 9/1988 | JP | 04-260696 | 9/1992 |
| JP | 63-252420 | 10/1988 | JP | 04-273120 | 9/1992 |
| JP | 63-266814 | 11/1988 | JP | 04-285167 | 10/1992 |
| JP | 64-009895 | 1/1989 | JP | 04-291916 | 10/1992 |
| JP | 64-009896 | 1/1989 | JP | 04-325500 | 11/1992 |
| JP | 64-009897 | 1/1989 | JP | 04-328874 | 11/1992 |
| JP | 64-037832 | 2/1989 | JP | 05-029228 | 2/1993 |
| JP | 64-082615 | 3/1989 | JP | 05-047665 | 2/1993 |
| JP | 64-082617 | 3/1989 | JP | 05-047666 | 2/1993 |
| JP | 64-082671 | 3/1989 | JP | 05-047668 | 2/1993 |
| JP | 64-082676 | 3/1989 | JP | 05-074717 | 3/1993 |
| JP | 01-103982 | 4/1989 | JP | 05-074724 | 3/1993 |
| JP | 01-103996 | 4/1989 | JP | 05-102189 | 4/1993 |
| JP | 64-090524 | 4/1989 | JP | 05-160152 | 6/1993 |
| JP | 01-117037 | 5/1989 | JP | 05-175143 | 7/1993 |
| JP | 01-143221 | 6/1989 | JP | 05-175145 | 7/1993 |
| JP | 01-143233 | 6/1989 | JP | 05-182906 | 7/1993 |
| JP | 01-154511 | 6/1989 | JP | 05-186295 | 7/1993 |
| JP | 01-236657 | 9/1989 | JP | 05-206036 | 8/1993 |
| JP | 01-245512 | 9/1989 | JP | 05-234899 | 9/1993 |
| JP | 01-264218 | 10/1989 | JP | 05-235047 | 9/1993 |
| JP | 01-270593 | 10/1989 | JP | 05-251339 | 9/1993 |
| JP | 01-272108 | 10/1989 | JP | 05-270997 | 10/1993 |
| JP | 01-290221 | 11/1989 | JP | 05-283336 | 10/1993 |
| JP | 01-290222 | 11/1989 | JP | 05-291152 | 11/1993 |
| JP | 01-296673 | 11/1989 | JP | 05-304334 | 11/1993 |
| JP | 01-303770 | 12/1989 | JP | 05-343327 | 12/1993 |
| JP | 01-305894 | 12/1989 | JP | 05-343685 | 12/1993 |
| JP | 01-313927 | 12/1989 | JP | 06-045606 | 2/1994 |
| JP | 02-012814 | 1/1990 | JP | 06-132236 | 5/1994 |
| JP | 02-014513 | 1/1990 | JP | 06-177381 | 6/1994 |
| JP | 02-017634 | 1/1990 | JP | 06-196809 | 7/1994 |
| JP | 02-063115 | 3/1990 | JP | 06-222388 | 8/1994 |
| JP | 02-074029 | 3/1990 | JP | 06-224138 | 8/1994 |
| JP | 02-074587 | 3/1990 | JP | 06-230421 | 8/1994 |
| JP | 02-106822 | 4/1990 | JP | 06-252057 | 9/1994 |
| JP | 02-129913 | 5/1990 | JP | 06-291048 | 10/1994 |
| JP | 02-162717 | 6/1990 | JP | 07-070752 | 3/1995 |
| JP | 02-172895 | 7/1990 | JP | 07-086269 | 3/1995 |
| JP | 02-196092 | 8/1990 | JP | 08-183076 | 7/1996 |
| JP | 02-203517 | 8/1990 | JP | 08-245291 | 9/1996 |
| JP | 02-230690 | 9/1990 | JP | 08-264530 | 10/1996 |
| JP | 02-230722 | 9/1990 | JP | 09-260786 | 10/1997 |
| JP | 02-246161 | 10/1990 | JP | 09-293681 | 11/1997 |
| JP | 02-264491 | 10/1990 | JP | 10-188840 | 7/1998 |
| JP | 02-283084 | 11/1990 | JP | 10-190128 | 7/1998 |
| JP | 02-304916 | 12/1990 | JP | 10-308283 | 11/1998 |
| JP | 03-019211 | 1/1991 | JP | 11-269652 | 10/1999 |
| JP | 03-022569 | 1/1991 | JP | 2000-031387 | 1/2000 |
| JP | 03-023294 | 1/1991 | JP | 2000-058777 | 2/2000 |
| JP | 03-023299 | 1/1991 | JP | 2000-068072 | 3/2000 |
| JP | 03-044967 | 2/1991 | JP | 2000-087029 | 3/2000 |
| JP | 03-048421 | 3/1991 | JP | 2000-319772 | 3/2000 |
| JP | 03-070124 | 3/1991 | JP | 2000-138094 | 5/2000 |
| JP | 03-185716 | 8/1991 | JP | 2000-218445 | 8/2000 |
| JP | 03-208885 | 9/1991 | JP | 2000-319772 | 11/2000 |
| JP | 03-234025 | 10/1991 | JP | 2000-340883 | 12/2000 |
| JP | 03-286522 | 12/1991 | JP | 2000-353666 | 12/2000 |
| JP | 03-286531 | 12/1991 | JP | 2001-111000 | 12/2000 |
| JP | 04-031391 | 2/1992 | JP | 2001-020075 | 1/2001 |
| JP | 04-031396 | 2/1992 | JP | 2001-62244 | 3/2001 |
| JP | 04-031396 A | 2/1992 | JP | 2001-152339 | 6/2001 |
| JP | 04-100292 | 4/1992 | JP | 2001-172767 | 6/2001 |
| JP | 04-111418 | 4/1992 | JP | 2001-189312 | 7/2001 |
| JP | 04-132214 | 5/1992 | JP | 2001-217206 | 8/2001 |
| JP | 04-132681 | 5/1992 | JP | 2001-220287 | 8/2001 |

| | | |
|---|---|---|
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | 90/02216 | 3/1990 |
| WO | WO/91/00510 | 1/1991 |
| WO | 93/02111 A1 | 2/1993 |
| WO | 96/17107 A1 | 6/1996 |
| WO | 96/18756 A1 | 6/1996 |
| WO | 98/06889 | 2/1998 |
| WO | 98/51838 | 11/1998 |
| WO | WO 98/51838 | 11/1998 |
| WO | WO/99/01595 | 1/1999 |
| WO | 99/01595 | 1/1999 |
| WO | 99/13504 | 3/1999 |
| WO | 99/29924 | 6/1999 |
| WO | WO/99/29924 | 6/1999 |
| WO | 99/41423 A2 | 8/1999 |
| WO | WO 99/65064 | 12/1999 |
| WO | 00/11721 | 3/2000 |
| WO | 00/15865 | 3/2000 |
| WO | WO/00/15865 | 3/2000 |
| WO | 00/15881 A2 | 3/2000 |
| WO | 00/16377 A2 | 3/2000 |
| WO | 00/54320 A1 | 9/2000 |
| WO | WO 00/54320 | 9/2000 |
| WO | 00/63957 A1 | 10/2000 |
| WO | 00/79019 A1 | 12/2000 |
| WO | 00/79576 A1 | 12/2000 |
| WO | 00/79576 | 12/2000 |
| WO | 01/15220 A1 | 3/2001 |
| WO | 01/15220 | 3/2001 |
| WO | WO 01/17692 | 3/2001 |
| WO | 01/27346 A1 | 4/2001 |
| WO | 01/27347 A1 | 4/2001 |
| WO | 01/29280 A1 | 4/2001 |
| WO | 01/29891 A1 | 4/2001 |
| WO | 01/29893 A1 | 4/2001 |
| WO | 01/36702 A1 | 5/2001 |
| WO | 01/40541 A1 | 6/2001 |
| WO | 01/66832 A1 | 9/2001 |
| WO | WO 02/01628 A2 | 1/2002 |
| WO | WO 02/08488 | 1/2002 |
| WO | 02/45167 | 6/2002 |
| WO | WO 02/45871 A1 | 6/2002 |
| WO | 02/067319 | 8/2002 |

OTHER PUBLICATIONS

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35.

Ritala, et al. "Growth of Titanium Dioxide Thin Films by Atomic Layer Epitaxy," Thin Solid Films, vol. 225 No. 1–2 (Mar. 25, 1993) pp. 288–295.

Min, et al. "Chemical Vapor Deposition of Ti-Si-N Films With Alternating Source Supply," Mat. Rec. Soc. Symp. Proc. vol. (1999).

Klaus, et al. "Atomically Controlled Growth of Tungsten and Tungsten Nitride Using Sequential Surface Reactions," Applied Surface Science, 162–163 (2000) 479–491.

PCT International Search Report from International Application No. PCT/US02/19481, Dated Jan. 8, 2003.

Kitagawa et al. *Hydrogen-mediated low-temperature epitaxy of Si in plasma-enhanced chemical vapor deposition.* Applied Surface Science. pp. 30–34 (2000).

Klaus et al. *Atomically controlled growth of tungsten and tungsten nitride using sequential surface reactions.* Applied Surface Science, pp. 479–491 (2000).

Hultman, et al., "Review of the thermal and mechanical stability of TiN–based thin films", Zeitschrift Fur Metallkunde, 90(10) (Oct. 1999), pp. 803–813.

Klaus, et al., "Atomic Layer Deposition of SiO2 Using Catalyzed and Uncatalyzed Self-Limiting Surface Reactions", Surface Reviews & Letters, 6(3&4) (1999), pp. 435–448.

Yamaguchi, et al., "Atomic-layer chemical-vapor-deposition of silicon dioxide films with extremely low hydrogen content", Appl. Surf. Sci., vol. 130–132 (1998), pp. 202–207.

George, et al., "Surface Chemistry for Atomic Layer Growth", J. Phys. Chem., vol. 100 (1996), pp. 13121–13131.

George, et al., "Atomic layer controlled deposition of SiO2 and Al2O3 using ABAB . . . binary reaction sequence chemistry", Appl. Surf. Sci., vol. 82/83 (1994), pp. 460–467.

Wise, et al., "Diethyldiethoxysilane as a new precursor for SiO2 growth on silicon", Mat. Res. Soc. Symp. Proc., vol. 334 (1994), pp. 37–43.

Niinisto, et al., "Synthesis of oxide thin films and overlayers by atomic layer epitaxy for advanced applications", Mat. Sci. & Eng., vol. B41 (1996), pp. 23–29.

Ritala, et al., "Perfectly conformal TiN and Al2O3 films deposited by atomic layer deposition", Chemical Vapor Deposition, vol. 5(1) (Jan. 1999), pp. 7–9.

Min, et al., "Atomic layer deposition of TiN thin films by sequential introduction of Ti precursor and NH/sub3/", Symp.: Advanced Interconnects and Contact Materials and Processes for Future Integrated Circuits (Apr. 13–16, 1998), pp. 337–342.

Klaus, et al., "Atomic Layer Deposition of Tungsten using Sequential Surface Chemistry with a Sacrificial Stripping Reaction," Thin Solid Films 360 (2000), pp. 145–153, (Accepted Nov. 16, 1999).

Min, et al., "Metal-Organic Atomic-Layer Deposition of Titanium-Silicon-Nitride Films", Applied Physics Letters, American Inst. Of Physics, vol. 75(11) (Sept. 13, 1999).

Martensson, et al., "Atomic Layer Epitaxy of Copper on Tantalum", Chemical Vapor Deposition, 3(1) (Feb. 1, 1997), pp. 45–50.

Ritala, et al. "Atomic Layer Epitaxy Growth of TiN Thin Films", J. Electrochem. Soc., 142(8) (Aug. 1995), pp. 2731–2737.

Elers, et al., "NbCl5 as a precursor in atomic layer epitaxy", Appl. Surf. Sci., vol. 82/83 (1994), pp. 468–474.

Lee, "The Preparation of Titanium–Based Thin Film by CVD Using Titanium Chlorides as Precursors", Chemical Vapor Deposition, 5(2) (Mar. 1999), pp. 69–73.

Martensson, et al., "Atomic Layer Epitaxy of Copper, Growth & Selectivity in the Cu (II)-2,2,6,6-Tetramethyl-3, 5-Heptanedion ATE/H2 Process", J. Electrochem. Soc., 145(8) (Aug. 1998), pp. 2926–2931.

Min, et al., "Chemical Vapor Deposition of Ti–Si–N Films with Alternating Source Supply", Mat., Res. Soc. Symp. Proc., vol. 564 (Apr. 5, 1999), pp. 207–210.

Bedair, "Atomic layer epitaxy deposition processes", J. Vac. Sci. Technol. 12(1) (Jan./Feb. 1994).

Yamaga, et al., "Atomic layer epitaxy of ZnS by a new gas supplying system in a low-pressure metalorganic vapor phase epitaxy", J. of Crystal Growth 117 (1992), pp. 152–155.

Elam, et al., "Nucleation and growth during tungsten atomic layer deposition on SiO2 surfaces," Thin Solid Films 386 (2001) pp. 41–52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low-temperature deposition of titanium nitride films from dialkylhydrazine-based precursors", Materials Science in Semiconductor Processing 2 (1999), pp. 149–157.

Suzuki, et al., "A 0.2-μm contact filling by 450° C-hydrazine-reduced TiN film with low resistivity", IEDM 92-979, pp. 11.8.1–11.8.3.

Suzuki, et al., "LPCVD-TiN Using Hydrazine and TiCl4", VMIC Conference (Jun. 8–9, 1993), pp. 418–423.

IBM Tech. Disc. Bull. Knowledge-Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some β-diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition/Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of TiB2 as a Diffusion Barrier on Silicon", J. Electrochem. Soc. 138(10) (Oct. 1991), pp. 3062–3067.

"Cluster Tools for Fabrication of Advanced devices" Jap. J. of Applied Physics, Extended Abstracts, 22nd Conference Solid State Devices and Materials (1990), pp. 849–852 XP000178141.

"Applications of Integrated processing", Solid State Technology, US, Cowan Pub., vol. 37, No. 12 (Dec. 1, 1994), pp. 45–47.

Kitigawa, et al., "Hydrogen-mediated low temperature epitaxy of Si in plasma-enhanced chemical vapor deposition", Applied Surface Science (2000), pp. 30–34.

Lee, et al., "Pulsed nucleation for ultra-high aspect ratio tungsten plugfill", Novellus Systems, Inc. (2001), pp. 1–2.

SYSTEM AND METHOD TO FORM A COMPOSITE FILM STACK UTILIZING SEQUENTIAL DEPOSITION TECHNIQUES

BACKGROUND OF THE INVENTION

This invention relates to the processing of semiconductor substrates. More particularly, this invention relates to improvements in the process of forming contacts.

Formation of contacts in multi-level integrated circuits poses many challenges to the semiconductor industry as the drive to increase circuit density continues, due to the reduction in size of the circuit features. Contacts are formed by depositing conductive interconnect material in an opening on the surface of insulating material disposed between two spaced-apart conductive layers. The aspect ratio of such an opening inhibits deposition of conductive interconnect material that demonstrates satisfactory step coverage and gap-fill, employing traditional interconnect material such as aluminum. In addition, diffusion between the aluminum and the surrounding insulating material often occurs, which adversely effects operation of the resulting electrical circuits.

Barrier materials have been introduced to improve both the step coverage and gap-fill of aluminum, while limiting diffusion of the same. Barrier materials must also provide good adhesion properties for aluminum. Otherwise, the thermal and electrical conductance of the resulting contact may be compromised. Examples of barrier materials providing the aforementioned characteristics include TiN, TiW, $TiB_2$, TiC and $Ti_2N$.

However, attempts have been made to provide interconnect material with lower electrical resistivity than aluminum. This has led to the substitution of copper aluminum. Copper, like aluminum, also suffers from diffusion characteristics and may form undesirable intermetallic alloys that reduce the availability of suitable barrier materials.

Tungsten has proved to be a suitable barrier material that effectively prevents diffusion of copper. Typically deposited employing chemical vapor deposition (CVD) techniques, tungsten deposition is attendant with several disadvantages. Tungsten diffuses easily into surrounding dielectric material. In addition, tungsten has proven difficult to deposit uniformly. This has been shown by variance in tungsten layers' thickness of greater than 1%. As result, it is difficult to control the resistivity of a tungsten layer.

What is needed, therefore, are improved techniques to form barrier layers for copper interconnects that include tungsten.

SUMMARY OF THE INVENTION

One embodiment of the present invention is directed to a method to form a stacked barrier layer on a substrate disposed in a processing chamber by serially exposing the substrate to first and second reactive gases to form an adhesion layer. The adhesion layer is then serially exposed to third and fourth reactive gases to form a barrier layer adjacent to the adhesion layer. A copper layer is disposed adjacent to the barrier layer. To that end, another embodiment of the invention is directed to a system to carry out the method.

BRIEF DESCRIPTION OF THE DRAWINGS

Figure 9:
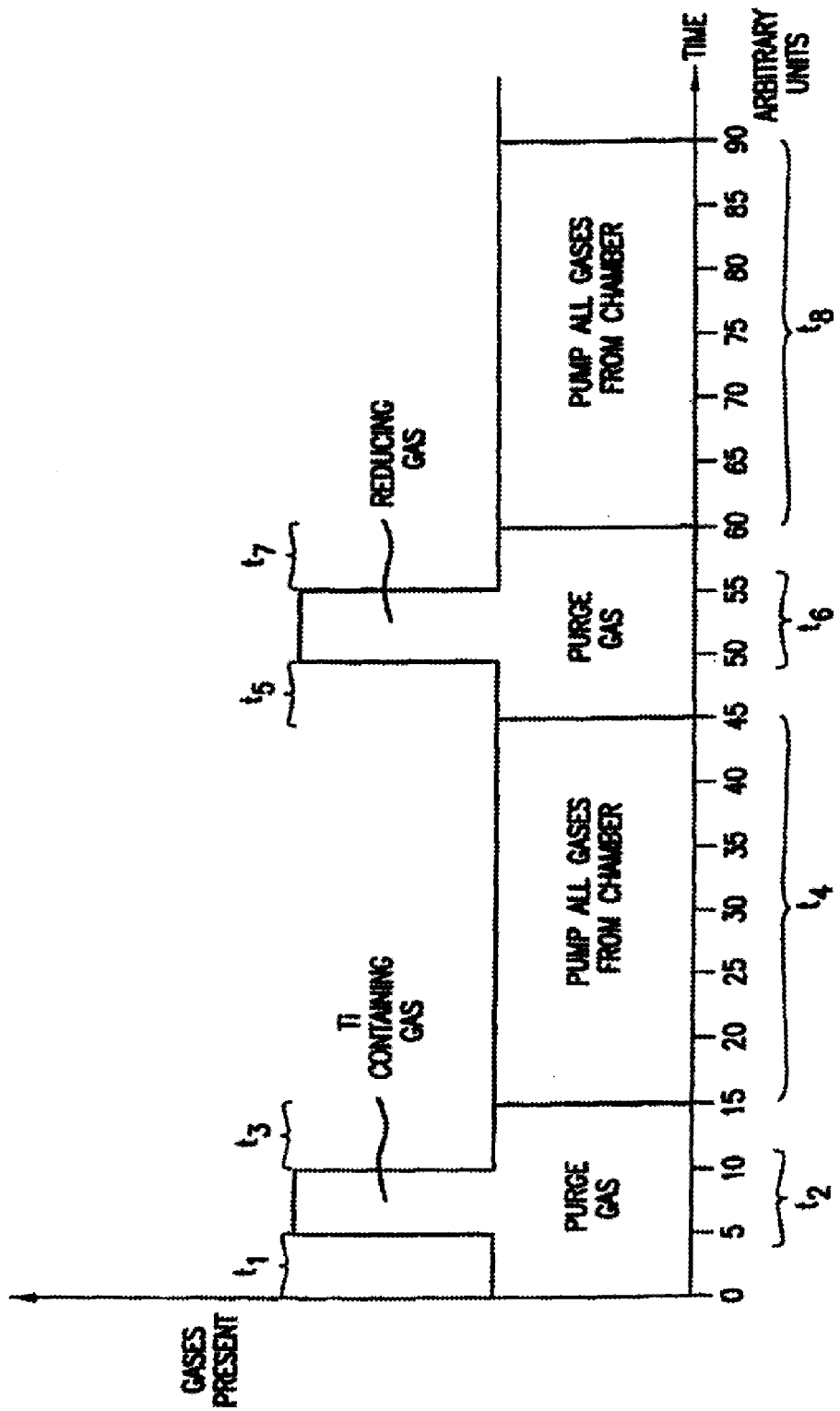
FIG. 9 is a graphical representation showing the concentration of gases introduced into the processing chamber shown above in FIG. 2, and the time in which the gases are present in the processing chamber to deposit the Titanium refractory metal layer shown above in FIG. 4, in accordance with one embodiment of the present invention.
Figure 10:
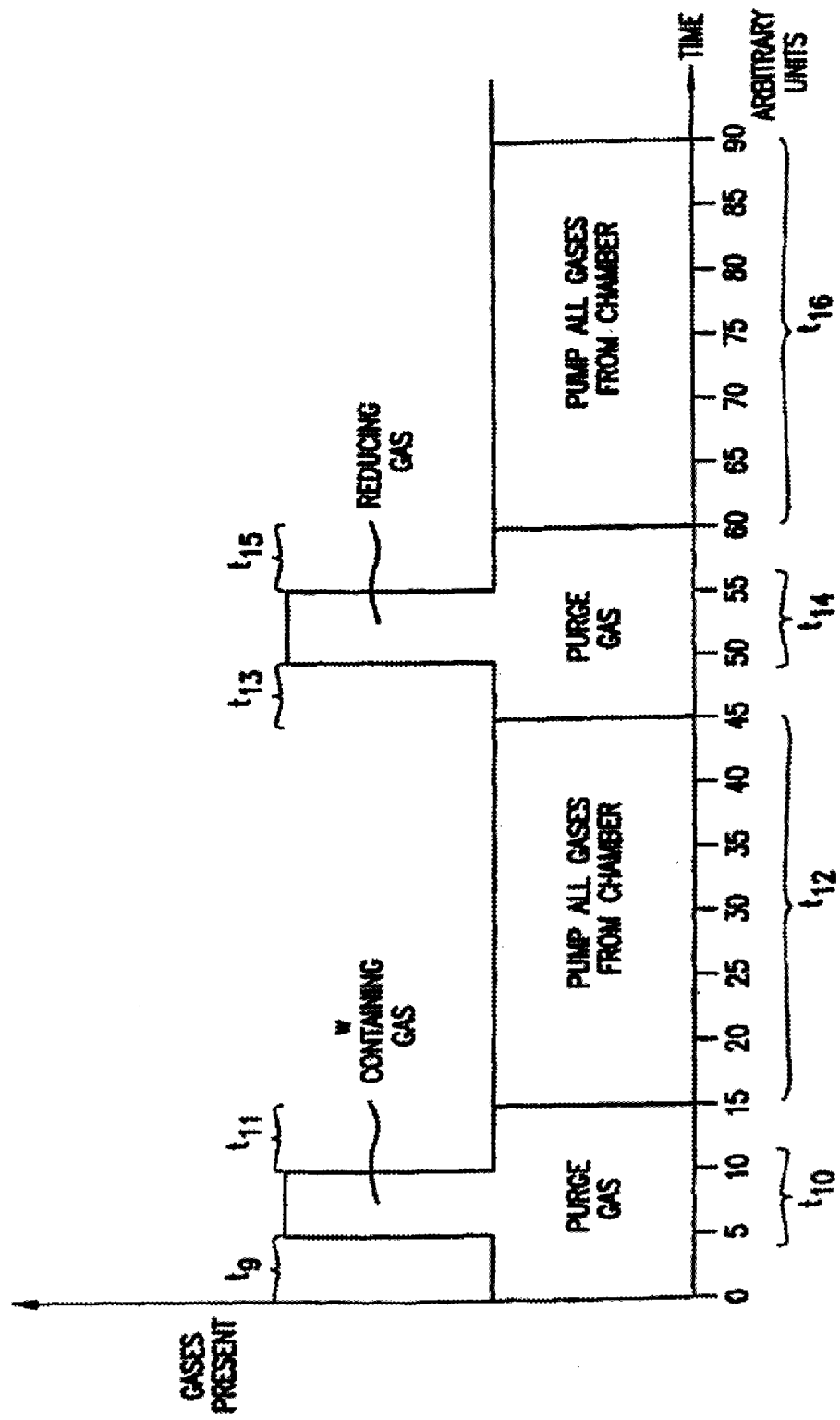

FIG. 1 is a perspective view of a semiconductor processing system in accordance with the present invention;

FIG. 2 is a detailed view of the processing chambers shown above in FIG. 1;

FIG. 3 is a detailed cross-sectional view of a substrate shown above in FIG. 2 before deposition of a first refractory metal layer in accordance with one embodiment of the present invention;

FIG. 4 is a detailed cross-sectional view of the substrate shown above in FIG. 3 after deposition of a first refractory metal layer in accordance with one embodiment of the present invention;

FIG. 5 is a detailed cross-sectional view of a substrate shown above in FIG. 4 after deposition of a second refractory metal layer in accordance with one embodiment of the present invention;

FIG. 6 is a detailed cross-sectional view of a substrate shown above in FIG. 2 after deposition of a copper contact in accordance with one embodiment of the present invention;

FIG. 7 is a schematic view showing deposition of a first molecule onto a substrate during sequential deposition techniques in accordance with one embodiment of the present invention;

FIG. 8 is a schematic view showing deposition of second molecule onto a substrate during sequential deposition techniques in accordance with one embodiment of the present invention;

FIG. 9 is a graphical representation showing the concentration of gases introduced into the processing chamber shown above in FIG. 2, and the time in which the gases are present in the processing chamber to deposit the Titanium refractory metal layer shown above in FIG. 4, in accordance with one embodiment of the present invention; and FIG. 10 is a graphical representation showing the concentration of gases introduced into the processing chamber shown above in FIG. 2, and the time in which the gases are present in the processing chamber to deposit the Tungsten layer shown above in FIG. 4, in accordance with one embodiment of the present invention.

DETAILED DESCRIPTION OF THE INVENTION

Referring to FIG. 1, an exemplary wafer processing system includes one or more processing chambers 12, 13 and 14 disposed in a common work area 16 surrounded by a wall 18. Processing chambers 12 and 14 are in data communication with a controller 22 that is connected to one or more monitors, shown as 24 and 26. Monitors 24 and 26 typically display common information concerning the process associated with the processing chambers 12 and 14. Monitor 26 is mounted to the wall 18, with monitor 24 being disposed in the work area 16. Operational control of processing chambers 12 and 14 may be achieved with use of a light pen, associated with one of monitors 24 and 26, to communicate with controller 22. For example, a light pen 28a is associated with monitor 24 and facilitates communication with the controller 22 through monitor 24. A light pen 28b facilitates communication with controller 22 through monitor 26.

Referring both the to FIGS. 1 and 2, each of processing chambers 12 and 14 includes a housing 30 having a base wall 32, a cover 34, disposed opposite to the base wall 32, and a sidewall 36, extending therebetween. Housing 30 defines a chamber 37, and a pedestal 38 is disposed within processing chamber 37 to support a substrate 42, such as a semiconductor wafer. Pedestal 38 may be mounted to move between the cover 34 and base wall 32, using a displacement mechanism (not shown), but is typically fixed proximate to bottom wall 32. Supplies of processing gases 39a, 39b, 39c, 39d and 39e are in fluid communication with the processing chamber 37 via a showerhead 40. Regulation of the flow of gases from supplies 39a, 39b and 39c is effectuated via flow valves 41.

Depending on the specific process, substrate 42 may be heated to a desired temperature prior to layer deposition via a heater embedded within pedestal 38. For example, pedestal 38 may be resistively heated by applying an electric current from an AC power supply 43 to a heater element 44. Substrate 42 is, in turn, heated by pedestal 38, and can be maintained within a desired process temperature range of, for example, about 20° C. to about 750° C., with the actual temperature varying dependent upon the gases employed and the topography of the surface upon which deposition is to occur. A temperature sensor 46, such as a thermocouple, is also embedded in the wafer support pedestal 38 to monitor the temperature of the pedestal 38 in a conventional manner. For example, the measured temperature may be used in a feedback loop to control the electrical current applied to heater element 44 by the power supply 43, such that the wafer temperature can be maintained or controlled at a desired temperature the is suitable for the particular process application. Pedestal 38 is optionally heated using radiant heat (not shown). A vacuum pump 48 is used to evacuate processing chamber 37 and to help maintain the proper gas flows and pressure inside processing chamber 37.

Referring to FIGS. 1 and 3, one or both of processing chambers 12 and 14, discussed above, may operate to form, on substrate 42, a contact in accordance with the present invention on substrate 42. To that end, substrate 42 includes a wafer 50 that may be formed from any material suitable for semiconductor processing, such as silicon. One or more layers, shown as layer 52, may be present on wafer 50. Layer 52 may be formed from any suitable material, including dielectric or conductive materials. Layer 52 includes a void 54, exposing a region 56 of substrate 42.

Referring to FIG. 4, formed adjacent to layer 52 and region 54 is a layer containing a refractory metal compound, such as titanium. In the present example, layer 58 is formed from titanium nitride, TiN, by sequentially exposing substrate 42 to processing gases to chemisorb monolayers of differing compounds onto the substrate, discussed more fully below. Layer 58 conforms to the profile of the void 54 so as to cover region 56 and layer 52.

Referring to FIG. 5, adjacent to layer 58 is formed an additional refractory metal layer 60. In the present example, layer 60 is formed from tungsten in the manner discussed above with respect to layer 52, except using different process gases. Layer 60 conforms to the profile of layer 58 and, therefore, conforms to the profile of void 54.

Referring to FIG. 6, shown is one example of a contact 62 formed in void 54 in accordance with the present invention by deposition of a layer of copper 64 that fills void 54, using standard deposition techniques. With this configuration, a stacked barrier layer consisting of TiN layer 58 and W layer 60 surrounds contact 62. TiN layer 58 serves as an adhesion layer to facilitate nucleation and deposition by W layer 60. TiN layer also serves as a diffusion barrier to reduce, if not prevent, diffusion of W into the surrounding environs, such as region 56 and layer 52. W layer 60 serves as a barrier layer for contact 62, thereby preventing copper material from diffusing into or through TiN layer 58 and into the environs surrounding void 54. Employing sequential deposition techniques, such as atomic layer deposition, provides superior thermal and conductive characteristics of the aforementioned stacked barrier layer. Specifically, the sequential deposition techniques described below enable precise control over the thickness of both layers 58 and 60.

Referring to FIGS. 1, 6 and 7, one or both of processing chambers 12 and 14, discussed above, may operate to deposit layers 58 and 60 on substrate 42 employing sequential deposition techniques. Specifically, the initial surface of substrate 42, e.g., the surface of region 56 and the surface of layer 52, presents an active ligand to the process region. A batch of a first processing gas, in this case $Aa_x$, results in a layer of A being deposited on substrate 42 having a surface of ligand x exposed to the processing chamber 37. Thereafter, a purge gas enters processing chamber 37 to purge the gas $Aa_x$. After purging gas $Aa_x$ from processing chamber 37, a second batch of processing gas, $Bb_y$, is introduced into processing chamber 37. The a ligand present on the substrate surface reacts with the b ligand and B atom, releasing molecules ab and Ba, that move away from substrate 42 and are subsequently pumped from processing chamber 37. In this manner, a surface comprising a monolayer of A atoms remains upon substrate 42 and exposed to processing chamber 37, shown in FIG. 4. The process proceeds cycle after cycle, until the desired thickness is achieved.

Referring to both FIGS. 2 and 8, although any type of processing gas may be employed, in the present example, the processing gas $Aa_x$ is a titanium-containing gas selected from the group that includes TDMAT, TDEAT and $TiCl_4$. The processing gas $Bb_y$ functions as a reducing agent and is selected from the group including $H_2$, $B_2H_6$, $SiH_4$ and $NH_3$. Two purge gases were employed: Ar and $N_2$. Each of the processing gases is flowed into processing chamber 37 with a carrier gas, which in this example, is one of the purge gases. It should be understood, however, that the purge gas may differ from the carrier gas, discussed more fully below. One cycle of the sequential deposition technique in accordance with the present invention includes flowing a purge gas into processing chamber 37 during time $t_1$ before the titanium-containing gas is flowed into processing chamber 37. During time $t_2$, the titanium-containing processing gas is flowed into the processing chamber 37, along with a carrier gas. After $t_2$ has lapsed, the flow of titanium-containing gas terminates and the flow of the carrier gas continues during time $t_3$, purging the processing chamber of the titanium-containing processing gas. During time $t_4$, the processing chamber 37 is pumped so as to remove all gases. After pumping of processing chamber 37, a carrier gas is introduced during time $t_5$, after which time the reducing process gas is introduced into the processing chamber 37 along with the carrier gas, during time $t_6$. The flow of the reducing process gas into processing chamber 37 is subsequently terminated. After the flow of reducing process gas into processing chamber 37 terminates, the flow of carrier gas continues, during time $t_7$. Thereafter, processing chamber 37 is pumped so as to remove all gases therein, during time $t_8$, thereby concluding one cycle of the sequential deposition technique in accordance with the present invention. The aforementioned cycle is repeated multiple times until layer 58 reaches a desired thickness. After TiN layer 58 reaches a desired thickness, W layer 60 is deposited adjacent thereto employing sequential deposition techniques.

Referring to FIGS. 2 and 10 to form W layer 60, processing gas $Aa_x$ may be any known tungsten-containing gas, such a tungsten hexafluoride, $WF_6$. The processing gas $Bb_y$ functions as a reducing agent and is selected from the group including $SiH_4$, $B_2H_6$ and $NH_3$. The same purge gases may be employed, as discussed above. Each of the processing gases is flowed into the processing chamber 37 with a carrier gas, as discussed above. One cycle of the sequential deposition technique to form W layer 60 in accordance with the present invention includes flowing a purge gas into the processing chamber 37 during time $t_9$, before the tungsten-containing gas is flowed into the processing chamber 37. During time $t_{10}$, the tungsten-containing processing gas is flowed into the processing chamber 37, along with a carrier gas. After time $t_{10}$ has lapsed, the flow of tungsten-containing gas terminates and the flow of the carrier gas continues during time $t_{11}$, purging the processing chamber of the tungsten-containing processing gas. During time $t_{12}$, processing chamber 37 is pumped so as to remove all gases. After pumping of the process chamber 37, a carrier gas is introduced during time $t_{13}$, after which time the reducing process gas is introduced into the processing chamber 37 along with the carrier gas, during time $t_{14}$. The flow of the reducing process gas into processing chamber 37 is subsequently terminated. After the flow of reducing process gas into the processing chamber 37 terminates, the flow of carrier continues during time $t_{15}$. Thereafter, the processing chamber 37 is pumped so as to remove all gases therein, during time $t_{16}$, thereby concluding one cycle of the sequential deposition technique in accordance with the present invention. The aforementioned cycle is repeated multiple times until layer 60 reaches a desired thickness. After W layer 60 reaches a desired thickness, the contact 62, shown in FIG. 6 may be deposited employing known techniques.

The benefits of employing sequential deposition are manifold, including flux-independence of layer formation that provides uniformity of deposition independent of the size of a substrate. For example, the measured difference of the layer uniformity and thickness measured between of 200 mm substrate and a 300 mm substrate deposited in the same chamber is negligible. This is due to the self-limiting characteristics of chemisorption. Further, the chemisorption characteristics contribute to near-perfect step coverage over complex topography.

In addition, the thickness of the layers 58 and 60 may be easily controlled while minimizing the resistance of the same by employing sequential deposition techniques. In one example of the present invention, layers 58 and 60, as well as contact 62 may be deposited in a common processing chamber, for example chambers 12 and 14. To provide added flexibility when depositing layers 58 and 60, as well as contact 62, a bifurcated deposition process may be practiced in which layer 58 is deposited in one process chamber, for example chamber 12, and layer 60 is deposited in a separate chamber, for example chamber 14. This may reduce the deposition time of each of layers 58 and 60 by, inter alia, having each processing chamber 12 and 14 preset to carry-out the process parameters necessary to deposit the requisite refractory metal layers.

Referring again to FIG. 2, the process for depositing the tungsten layer may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, Fortran, and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled Windows® library routines. To execute the linked and compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted. Further, the sequence of gases may utilize a different initial sequence. For example, the initial sequence may include exposing the substrate to the reducing gas before the metal-containing gas is introduced into the processing chamber. In addition, other stacked layers may be deposited, in addition to the refractory-metal layers described above and for purposes other than formation of a barrier layer. Therefore, the scope of the invention should not be based upon the foregoing description. Rather, the scope of the invention should be determined based upon the claims recited herein, including the full scope of equivalents thereof.

What is claimed is:

1. A method for forming a stacked barrier layer on a substrate disposed in a processing chamber, comprising:
   serially exposing said substrate to first and second reactive gases to form an adhesion layer; and
   serially exposing said adhesion layer to third and fourth reactive gases to form a barrier layer adjacent to said adhesion layer.

2. The method as recited in claim 1 further including depositing a layer of copper adjacent to said barrier layer.

3. The method as recited in claim 1 further including repeating serially exposing said substrate to first and second reactive gases to form said adhesion layer to a desired thickness before serially exposing said adhesion layer to third and fourth reactive gases.

4. The method as recited in claim 3 further including repeating serially exposing said substrate to third and fourth reactive gases to form said barrier layer to a desired thickness after serially exposing said substrate to first and second reactive gases.

5. The method as recited in claim 1 further including providing first and second processing chambers wherein serially exposing said substrate to first and second reactive gases further includes serially exposing said substrate to said first and second reactive gases while said substrate is disposed in said first processing chamber and serially exposing said adhesion layer to third and fourth reactive gases further includes serially exposing said adhesion layer to third and fourth reactive gases while said substrate is positioned in said second processing chamber.

6. The method as recited in claim 3 further including providing first and second processing chambers wherein serially exposing said substrate to first and second reactive gases further includes serially exposing said substrate to said first and second reactive gases while said substrate is disposed in said first processing chamber and serially exposing said adhesion layer to third and fourth reactive gases further includes serially exposing said adhesion layer to third and fourth reactive gases while said substrate is positioned in said first processing chamber and depositing a layer of copper adjacent to said barrier layer further includes depositing a copper layer adjacent to said barrier layer when said substrate is positioned in said second processing chamber.

7. The method as recited in claim 1 further including providing first, second and third processing chambers wherein serially exposing said substrate to first and second reactive gases further includes serially exposing said substrate to said first and second reactive gases while said substrate is disposed in said first processing chamber and serially exposing said adhesion layer to third and fourth reactive gases further includes serially exposing said adhesion layer to third and fourth reactive gases while said substrate is positioned in said second processing chamber and depositing a layer of copper adjacent to said barrier layer further includes depositing a copper layer adjacent to said barrier layer when said substrate is positioned in said third processing chamber.

8. The method as recited in claim 1 wherein serially exposing said substrate further includes introducing said second reactive gas into said processing chamber and further including purging said processing chamber of said second reactive gas before exposing said adhesion layer to said third reactive gas.

9. The method as recited in claim 1 wherein said first and third gases each includes a refractory metal compound, with the refractory metal compound associated with said first reactive gas differing from the refractory metal compound associated with said third reactive gas.

10. The method as recited in claim 1 wherein said first reactive gas is selected from the group consisting of TDMAT, TDEAT and TiCl$_4$ and said second reactive gas is selected from the group consisting of H$_2$, B$_2$H$_6$, SiH$_4$ and NH$_3$.

11. The method as recited in claim 1 wherein said third reactive gas is WF$_6$ and said fourth reactive gas is selected from the group consisting of SiH$_4$, B$_2$H$_6$ and NH$_3$.

12. The method as recited in claim 1 further comprising purging said processing chamber of said first reactive gas before introducing said second reactive gas by introducing a purge gas into said processing chamber after exposing said substrate to said first reactive gas and before exposing said substrate to said second reactive gas.

13. The method as recited in claim 1 further comprising purging said processing chamber of said first reactive gas before introducing said second reactive gas by pumping said processing chamber clear of said first reactive gas before introducing said second reactive gas.

14. The method as recited in claim 1 further comprising purging said processing chamber of said third reactive gas before introducing said fourth reactive gas by introducing a purge gas into said processing chamber after exposing said substrate to said third reactive gas and before exposing said substrate to said fourth reactive gas.

15. The method as recited in claim 1 further comprising purging said processing chamber of said third reactive gas before introducing said fourth reactive gas by pumping said processing chamber clear of said third reactive gas before introducing said fourth reactive gas.

16. A method for forming a stacked barrier layer on a substrate disposed in a processing chamber, said method comprising:
serially exposing said substrate to first and second reactive gases to form an adhesion layer by introducing said first reactive gas into said processing chamber and removing said first reactive gas from said processing chamber before introducing said second reactive gas;
repeating serially exposing said substrate to first and second reactive gases to form said adhesion layer to a desired thickness;
serially exposing said adhesion layer to third and fourth reactive gases to form a barrier layer adjacent to said adhesion layer by introducing said third reactive gas into said processing chamber and clearing said third reactive gas from said processing chamber before introducing said fourth reactive gas;
repeating serially exposing said substrate to third and fourth reactive gases to form said barrier layer to an acceptable thickness;
purging said processing chamber of said first and second reactive gases before introducing either of said third and fourth reactive gases; and
depositing a layer of copper adjacent to said barrier layer.

17. The method as recited in claim 16 wherein said first reactive gas is selected from the group consisting of TDMAT, TDEAT and TiCl$_4$, said second reactive gas is selected from the group consisting of H$_2$, B$_2$H$_6$, SiH$_4$ and NH$_3$, said third reactive gas is WF$_6$, and said fourth reactive gas is selected from the group consisting of SiH$_4$, B$_2$H$_6$ and NH$_3$.

18. The method as recited in claim 16 further comprising removing said first reactive gas from said processing chamber before introducing said second reactive gas by introducing an inert gas into said processing chamber, and clearing said third reactive gas from said processing chamber before introducing said fourth reactive gas by introducing an expulsion gas into said processing chamber.

19. The method as recited in claim 16 further comprising removing said first reactive gas from said processing chamber before introducing said second reactive gas by pumping said processing chamber clear of said first reactive gas, and clearing said third reactive gas from said processing chamber by pumping said processing chamber clear of said third reactive gas.

20. A method for forming a stacked barrier layer on a substrate surface, comprising:
exposing the substrate surface to a first reactive gas;
exposing the substrate surface to a second reactive gas;
sequentially repeating the exposure to the first and second reactive gases until an adhesion layer having a desired thickness is formed;
exposing the substrate surface to a third reactive gas;
exposing the substrate surface to a fourth reactive gas; and then
sequentially repeating the exposure to the third and fourth reactive gases until a barrier layer having a desired thickness is formed over the adhesion layer.

21. The method of claim 20, wherein the first reactive gas comprises a refractory metal-containing compound.

22. The method of claim 21, wherein the refractory metal-containing compound comprises TDMAT, TDEAT, TiCl$_4$, or combinations thereof.

23. The method of claim 21, wherein the second precursor gas comprises a reducing compound.

24. The method of claim 23, wherein the reducing compound comprises H$_2$, B$_2$H$_6$, SiH$_4$, NH$_3$, or combinations thereof.

25. The method of claim 21, wherein the third precursor gas comprises a refractory metal-containing compound.

26. The method of claim 25, wherein the refractory metal-containing compound comprises tungsten.

27. The method of claim 21, wherein the fourth comprises a reducing compound.

28. The method of claim 27, wherein the reducing compound comprises SiH$_4$, B$_2$H$_6$, NH$_3$, or combinations thereof.

29. The method of claim 20, further comprising depositing copper at least partially over the barrier layer.

30. The method of claim 20, wherein the adhesion layer is deposited within a first processing chamber.

31. The method of claim 30, wherein the barrier layer is deposited within a second processing chamber.

32. The method of claim 31, wherein the copper is deposited in a third processing chamber.

33. The method of claim 32, wherein the first, second and third processing chambers are each disposed about a common mainframe.

34. The method of claim 30, wherein the adhesion layer and the barrier layer are both deposited in the first chamber.

35. A method for depositing a barrier layer on a substrate surface, comprising:

sequentially exposing the substrate surface to a first refractory metal-containing compound and a first reducing compound; and sequentially exposing the substrate surface to a second refractory metal-containing compound and a second reducing compound to form the barrier layer.

36. The method of claim 35, wherein the first refractory metal-containing compound comprises TDMAT, TDEAT, $TiCl_4$, or combinations thereof.

37. The method of claim 35, wherein the second refractory metal-containing compound comprises tungsten.

38. The method of claim 35, wherein the first and second reducing compounds is selected from a group consisting of $SiH_4$, $B_2H_6$, $NH_3$, and combinations thereof.

39. The method of claim 35, wherein the barrier layer comprises titanium, titanium nitride, tungsten, tungsten nitride, or combinations thereof.

40. The method of claim 35, wherein the adhesion layer is deposited within a first processing chamber and the barrier layer is deposited within a second processing chamber.

41. The method of claim 35, further comprising depositing copper at least partially over the barrier layer.

42. The method of claim 41, wherein the adhesion layer is deposited within a first processing chamber and the barrier layer is deposited within a second processing chamber.

43. The method of claim 42, wherein the copper is deposited in a third processing chamber and the first, second and third processing chambers are each disposed about a common mainframe.

44. The method of claim 42, wherein the adhesion layer and the barrier layer are both deposited in the first chamber.

45. A method for forming a metal contact on a substrate surface, comprising:

sequentially exposing the substrate surface to a titanium-containing compound and a nitrogen-containing compound to form an adhesion layer comprising titanium nitride;

sequentially exposing the substrate surface to a tungsten-containing compound and a reducing compound to form a barrier layer comprising tungsten; and depositing copper at least partially over the barrier layer to form the metal contact.

46. The method of claim 45, wherein the tungsten-containing compound comprises TDMAT, TDEAT, $TiCl_4$, or combinations thereof.

47. The method of claim 45, wherein the reducing compound is selected from a group consisting of $SiH_4$, $B_2H_6$, $NH_3$, and combinations thereof.

48. The method of claim 45, wherein the adhesion layer is deposited within a first processing chamber and the barrier layer is deposited within a second processing chamber.

49. The method of claim 48, wherein the copper is deposited in a third processing chamber and the first, second and third processing chambers are each disposed about a common mainframe.

* * * * *